US011817832B2

(12) United States Patent
Liu et al.

(10) Patent No.: US 11,817,832 B2
(45) Date of Patent: Nov. 14, 2023

(54) POWER AMPLIFIER OUTPUT MATCHING

(71) Applicant: Skyworks Solutions, Inc., Irvine, CA (US)

(72) Inventors: Yang Liu, Irvine, CA (US); Yong Hee Lee, Tustin, CA (US); Thomas Obkircher, Santa Ana, CA (US); William J. Domino, Yorba Linda, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 273 days.

(21) Appl. No.: 17/137,031

(22) Filed: Dec. 29, 2020

(65) Prior Publication Data

US 2021/0211107 A1 Jul. 8, 2021

Related U.S. Application Data

(60) Provisional application No. 62/957,074, filed on Jan. 3, 2020.

(51) Int. Cl.
*H03F 3/191* (2006.01)
*H03F 3/213* (2006.01)
*H03F 1/56* (2006.01)
*H04B 1/40* (2015.01)
*H04B 1/3827* (2015.01)

(52) U.S. Cl.
CPC .............. *H03F 3/213* (2013.01); *H03F 1/565* (2013.01); *H04B 1/3827* (2013.01); *H04B 1/40* (2013.01); *H03F 2200/387* (2013.01); *H03F 2200/451* (2013.01)

(58) Field of Classification Search
CPC ........................................................ H03F 3/191

USPC .................................................. 330/302, 305
See application file for complete search history.

(56) References Cited

U.S. PATENT DOCUMENTS

| | | | |
|---|---|---|---|
| 5,969,575 | A | 10/1999 | Helms |
| 6,166,599 | A | 12/2000 | Aparin |
| 6,424,226 | B1 | 7/2002 | Thuis |
| 8,497,744 | B1 | 7/2013 | Wright |
| 8,598,950 | B2 | 12/2013 | Khesbak |

(Continued)

FOREIGN PATENT DOCUMENTS

| | | |
|---|---|---|
| CN | 103580610 A | 2/2014 |
| GB | 2292278 A | 2/1996 |

(Continued)

OTHER PUBLICATIONS

Data Sheet of SKY65170-21:860-960MHz, 0.5 W High Power Power Amplifier, Skyworks Solutions, Inc., Dec. 14, 2011 in 12 pages.

(Continued)

*Primary Examiner* — Henry Choe
(74) *Attorney, Agent, or Firm* — Knobbe, Martens, Olson & Bear, LLP

(57) ABSTRACT

A semiconductor-on-insulator die can include a power amplifier configured to amplify a radio frequency input signal having a fundamental frequency. The die can further include an output matching circuit including first and second second-order harmonic rejection circuits configured to resonate at about two times the fundamental frequency and a third order harmonic rejection circuit configured to resonate at about three times the fundamental frequency.

20 Claims, 17 Drawing Sheets

(56) References Cited

U.S. PATENT DOCUMENTS

| | | | |
|---|---|---|---|
| 8,606,198 | B1 | 12/2013 | Wright |
| 8,610,503 | B2 | 12/2013 | Kaczman et al. |
| 8,717,100 | B2 | 5/2014 | Reisner et al. |
| 8,736,378 | B1 | 5/2014 | Hau |
| 8,797,103 | B2 | 8/2014 | Kaczman et al. |
| 8,803,615 | B2 | 8/2014 | Cabanillas et al. |
| 9,231,536 | B2 | 1/2016 | Descios |
| 9,391,567 | B2 | 7/2016 | Kaczman |
| 9,537,452 | B2 * | 1/2017 | Samelis ................ H03F 3/195 |
| 9,660,688 | B2 | 5/2017 | Kaczman |
| 9,859,853 | B2 | 1/2018 | Kaczman |
| 9,882,538 | B2 | 1/2018 | Poulin et al. |
| 9,973,153 | B2 * | 5/2018 | Samelis ................ H03F 1/565 |
| 10,205,490 | B2 | 2/2019 | Wloczysiak et al. |
| 10,418,951 | B2 | 9/2019 | Poulin et al. |
| 2004/0041634 | A1 | 3/2004 | Sugiura |
| 2004/0075504 | A1 | 4/2004 | Vintola |
| 2004/0152426 | A1 | 8/2004 | Suzuki |
| 2005/0003855 | A1 | 1/2005 | Wada |
| 2007/0080750 | A1 | 4/2007 | Liebenrood |
| 2007/0096804 | A1 | 5/2007 | Bakalski |
| 2008/0026709 | A1 | 1/2008 | Liu |
| 2010/0308933 | A1 | 12/2010 | See |
| 2010/0321086 | A1 | 12/2010 | See |
| 2011/0003566 | A1 | 1/2011 | Makihara |
| 2011/0037516 | A1 | 2/2011 | Nejati |
| 2011/0215981 | A1 | 9/2011 | Kim |
| 2011/0237188 | A1 | 9/2011 | Sen |
| 2012/0075023 | A1 | 3/2012 | Guo |
| 2012/0182084 | A1 | 7/2012 | Peng |
| 2012/0229217 | A1 | 9/2012 | Kawano et al. |
| 2013/0049735 | A1 | 2/2013 | Shafer |
| 2013/0154735 | A1 | 6/2013 | Hase |
| 2014/0002187 | A1 | 1/2014 | McPartlin et al. |
| 2014/0002188 | A1 | 1/2014 | Chen |
| 2014/0055210 | A1 | 2/2014 | Black |
| 2014/0073267 | A1 | 3/2014 | Cabanillas et al. |
| 2014/0167856 | A1 | 6/2014 | Takahashi |
| 2014/0197892 | A1 | 7/2014 | Gorbachov |
| 2014/0266459 | A1 | 9/2014 | Scott |
| 2014/0312976 | A1 | 10/2014 | Noori et al. |
| 2015/0028945 | A1 | 1/2015 | Gaynor |
| 2015/0065070 | A1 | 3/2015 | Maxim |
| 2015/0091666 | A1 | 4/2015 | Higashide et al. |
| 2015/0137891 | A1 | 5/2015 | Xuan |
| 2015/0333706 | A1 | 11/2015 | Blednov |
| 2016/0285425 | A1 | 9/2016 | Poulin et al. |
| 2016/0294340 | A1 | 10/2016 | Goel |
| 2017/0170792 | A1 * | 6/2017 | Samelis ................ H03F 1/0277 |

FOREIGN PATENT DOCUMENTS

| | | |
|---|---|---|
| JP | 2006-526315 | 11/2006 |
| JP | 2014-090222 | 5/2014 |
| WO | WO01/05042 | 1/2001 |
| WO | WO2013/112627 | 8/2013 |
| WO | WO2014/013868 | 1/2014 |

OTHER PUBLICATIONS

Product Description of NPA1003, Gallium Nitride 28V, 5W, 20-1500 MHz MMIC Amplifier, NDS-202 Rev. 4. 011414, Nitronex, 2013 in 8 pages.

Komijani, Abbas et al., "A 24-GHz, +14.5-dBm Fully Integrated Power Amplifier in 0.18 -μm CMOS", IEEE Journal of Solid-State Circuits, vol. 40, No. 9, Sep. 2005, pp. 1901-1908.

Aoki, Ichiro, et al., "A Fully-Integrated Quad-Band GSM/GPRS CMOS Power Amplifier", IEEE Journal of Solid-State Circuits, vol. 43, No. 12, Dec. 2008, pp. 2747-2758.

* cited by examiner

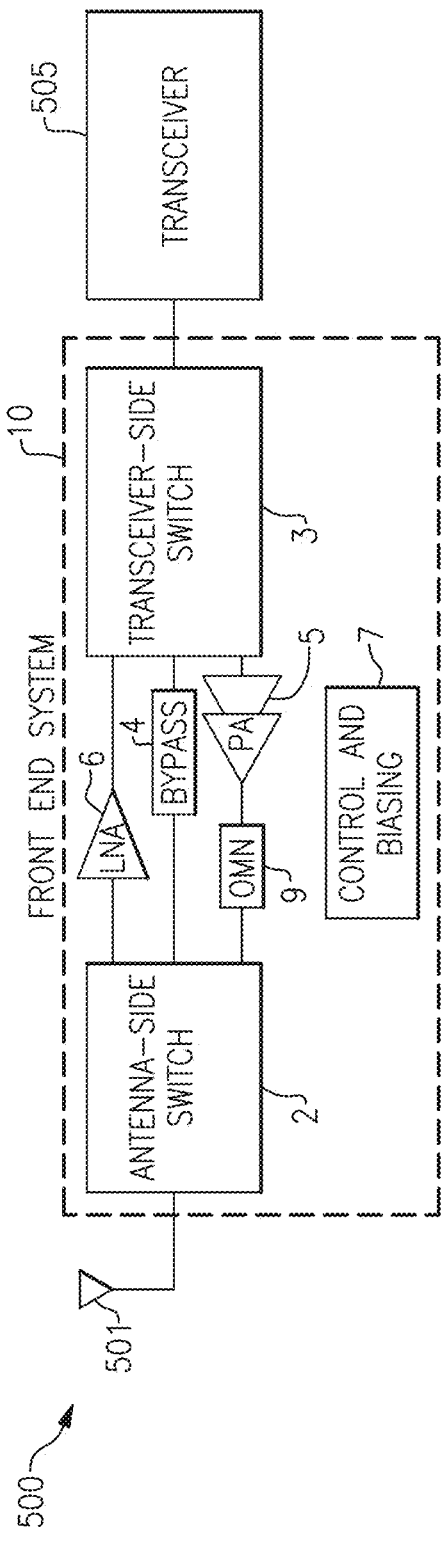
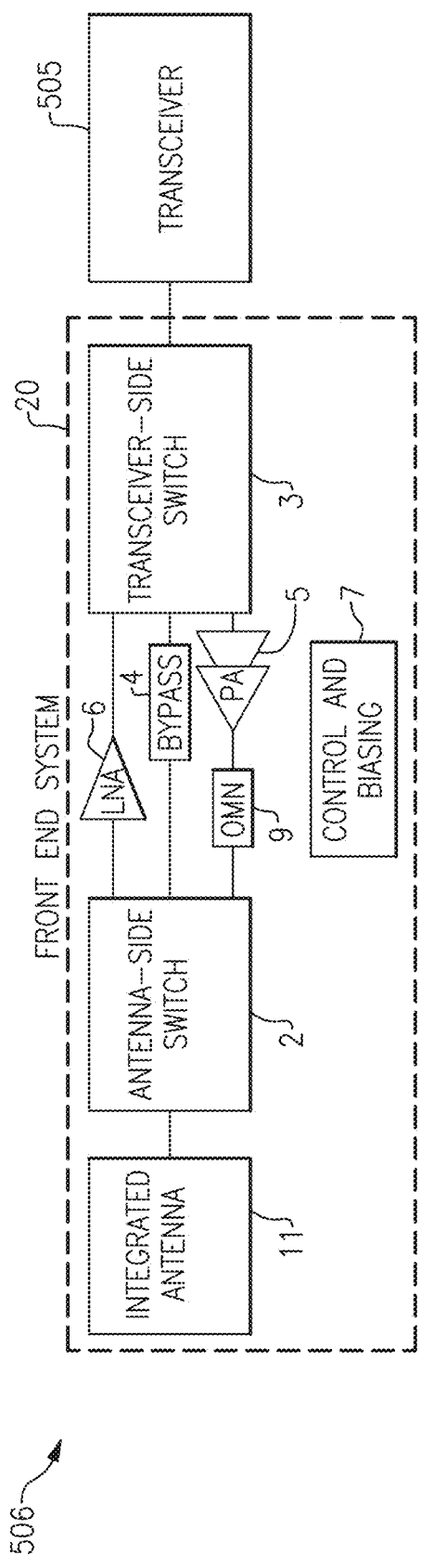
FIG.13A
FIG.13B

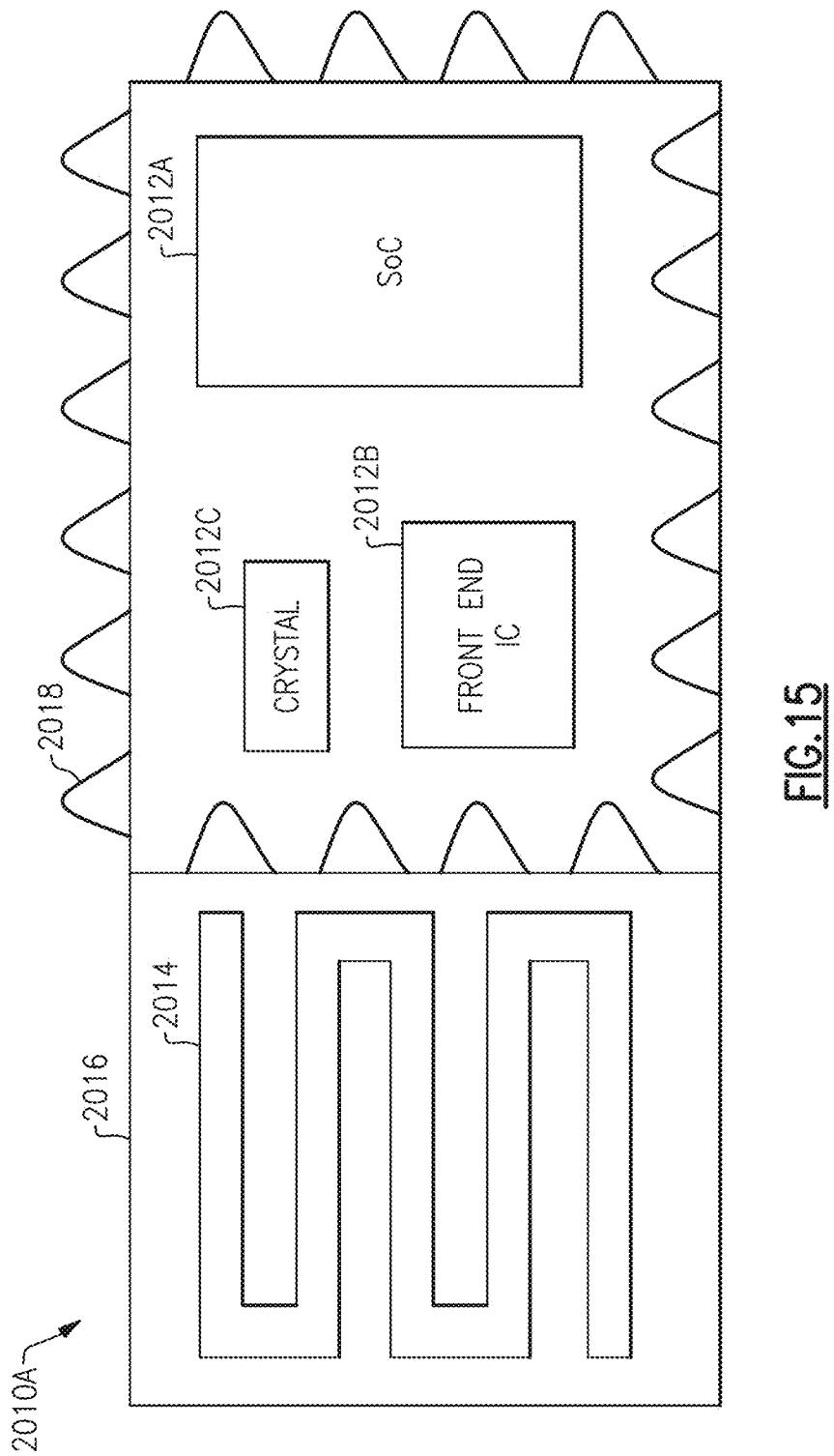

POWER AMPLIFIER OUTPUT MATCHING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to radio frequency electronic systems, such as front end systems and related devices, integrated circuits, modules, and methods.

Description of Related Technology

A radio frequency electronic system can process radio frequency signals in a frequency range from about 30 kilohertz (kHz) to 300 gigahertz (GHz), such as in a range from about 450 megahertz (MHz) to 6 GHz. A front end system is an example of a radio frequency electronic system. A front end system can be referred to as a radio frequency front end system. A front end system can process signals being transmitted and/or received via one or more antennas. For example, a front end system can include one or more switches, one or more filters, one or more low noise amplifiers, one or more power amplifiers, other circuitry, or any suitable combination thereof in one or more signal paths between one or more antennas and a transceiver. Front end systems can include one or more receive paths and one or more transmit paths.

A front-end system can include a power amplifier in a transmit path. Power amplifiers can be included in front-end systems in a wide variety of communications devices to amplify an RF signal for transmission. An RF signal amplified by a power amplifier can be transmitted via an antenna. Example communications devices having power amplifiers include, but are not limited to, Internet of Things (IoT) devices, mobile phones, tablets, base stations, network access points, laptops, computers, and televisions. As an example, in mobile phones that communicate using a cellular standard, a wireless local area network (WLAN) standard, and/or any other suitable communication standard, a power amplifier can be used to amplify the RF signal.

An output matching circuit can be included at the output of a power amplifier. The output matching circuit can be used to increase power transfer and/or reduce reflections of the amplified RF signal generated by the power amplifier.

SUMMARY

According to certain aspects of the disclosure, a power amplifier system includes a semiconductor-on-insulator die. The system further includes a power amplifier implemented on the semiconductor-on-insulator die and configured to amplify a radio frequency input signal having a fundamental frequency. The power amplifier can include an input configured to receive the radio frequency input signal and an output configured to provide an amplified radio frequency signal. The system further includes an output matching circuit implemented on the semiconductor-on-insulator die. The semiconductor-in-insulator die can include first and second second-order harmonic rejection circuits configured to resonate at about two times the fundamental frequency and a third order harmonic rejection circuit configured to resonate at about three times the fundamental frequency.

The power amplifier system can further include a third second-order harmonic rejection circuit. The first and second second-order harmonic rejection circuits can be harmonic short circuits. The third second-order harmonic rejection circuit can be a harmonic open circuit. The third-order harmonic rejection circuit can be a harmonic open circuit.

The first second-order harmonic rejection circuit can be positioned between the output of the power amplifier and a power low supply voltage. The third-order harmonic rejection circuit can be positioned between the output of the power amplifier and a first node. The third second-order harmonic circuit can be positioned between the first node and a second node. The second second-order harmonic circuit can be positioned between the second node and the power low supply voltage.

The system can further include biasing circuitry implemented on the die and configured to bias the power amplifier. The system can additionally include a switch implemented on the die and configured to control connection of signal paths to an antenna.

The power amplifier can include two field effect transistors arranged in a cascode configuration.

The third-order harmonic rejection circuit can include a capacitor and an inductor. The inductor can be implemented as a surface mount device on a module supporting the semiconductor-on-insulator die. The first second-order harmonic rejection circuit can include a tunable bank of at least two capacitors. The system can further include a biasing circuit including a decoupling capacitor and a choke inductor. The choke inductor can be embedded in a substrate of a module supporting the semiconductor-on-insulator die.

According to additional aspects, a semiconductor-on-insulator die includes a power amplifier configured to amplify a radio frequency input signal having a fundamental frequency, the power amplifier including an input configured to receive the radio frequency input signal and an output configured to provide an amplified radio frequency signal. The die further includes an output matching circuit including first and second second-order harmonic rejection circuits configured to resonate at about two times the fundamental frequency and a third order harmonic rejection circuit configured to resonate at about three times the fundamental frequency.

The die can further include a third second-order harmonic rejection circuit. The first and second second-order harmonic rejection circuits can be harmonic short circuits and the third second-order harmonic rejection circuit is a harmonic open circuit. The third-order harmonic rejection circuit can be a harmonic open circuit.

The power amplifier can include two field effect transistors arranged in a cascode configuration.

The die can further include biasing circuitry configured to bias the power amplifier, a switch configured to control connection of signal paths to an antenna, and a controller configured to control the power amplifier and the switch.

According to further aspects, a mobile device includes a module including a semiconductor-on-insulator die mounted thereon. The die includes a power amplifier configured to amplify a radio frequency input signal having a fundamental frequency. The power amplifier can include an input configured to receive the radio frequency input signal and an output configured to provide an amplified radio frequency signal. The die can further include an output matching circuit including first and second second-order harmonic rejection circuits configured to resonate at about two times the fundamental frequency and a third order harmonic rejection circuit configured to resonate at about three times the fundamental frequency. The mobile device can further include a radio frequency antenna, which in some embodiments is included on the module.

The mobile device can further include a biasing circuit including a decoupling capacitor and a choke inductor. The decoupling capacitor can be implemented on the die. The choke inductor can be embedded in a substrate of the module. The third order harmonic rejection circuit includes a capacitor implemented on the die and a surface mounted inductor mounted on the module.

BRIEF DESCRIPTION OF THE DRAWINGS

FIG. 13A illustrates a schematic block diagram of one example of a radio frequency system.

FIG. 13B illustrates a schematic block diagram of another example of a radio frequency system.

FIG. 15 is a schematic diagram of an example of a radio frequency module according to an embodiment.

DETAILED DESCRIPTION OF CERTAIN EMBODIMENTS

Figure 1A:
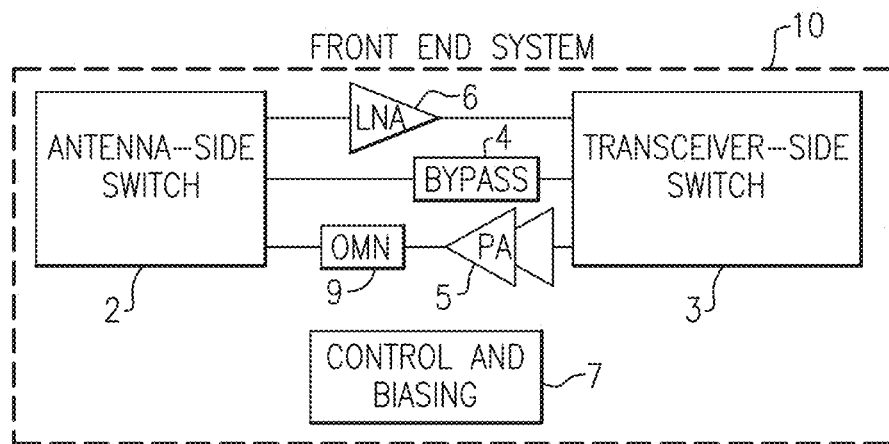
FIG. 1A illustrates a schematic block diagram of one example of a front end system.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Front End Systems

A front end system can be used to handle signals being transmitted and/or received via one or more antennas. For example, a front end system can include switches, filters, amplifiers, and/or other circuitry in signal paths between one or more antennas and a transceiver.

Implementing one or more features described herein in a front end system can achieve a number of advantages, including, but not limited to, one or more of higher power added efficiency (PAE), more compact layout, lower cost, higher linearity, superior robustness to overstress, and/or enhanced integration. Moreover, implementing one or more features described herein in a front end system can achieve desirable figure of merit (FOM) and/or other metrics by which front end systems are rated. Although some features are described herein in connection with front end systems for illustrative purposes, it will be understood that the principles and advantages described herein can be applied to a wide variety of other electronics.

FIG. 1A illustrates a schematic block diagram of one example of a front end system 10. The front end system 10 includes an antenna-side switch 2, a transceiver-side switch 3, a bypass circuit 4, a power amplifier 5, an output matching network 9 connected to an output of the power amplifier 5, a low noise amplifier (LNA) 6, and a control and biasing circuit 7. The front end system 10 can incorporate one or more features described in the sections herein.

Although one example of a front end system is shown in FIG. 1A, a front end system can be adapted in a wide variety of ways. For example, a front end system can include more or fewer components and/or signals paths. Accordingly, the teachings herein are applicable to front end systems implemented in a wide variety of ways.

In certain implementations, a front end system, such as the front end system 10 of FIG. 1A, is implemented on an integrated circuit or semiconductor die. In such implementations, the front end system can be referred to as a front end integrated circuit (FEIC). In other implementations, a front end system is implemented as a module. In such implementations, the front end system can be referred to as a front end module (FEM).

Accordingly, in some implementations, the front end system 10 is implemented in a packaged module. Such packaged modules can include a relatively low cost laminate and one or more dies that combine low noise amplifiers with power amplifiers and/or switch functions. Some such packaged modules can be multi-chip modules. In certain implementations, some or the all of the illustrated components of the front end system 10 can be embodied on a single integrated circuit or die. Such a die can be manufactured using any suitable process technology. As one example, the die can be a semiconductor-on-insulator die, such as a silicon-on-insulator (SOI) die. Using silicon-on-insulator or other semiconductor-on-insulator technology and stacked transistor topologies can enable power amplifiers to be implemented in relatively inexpensive and relatively reliable technology. Moreover, the desirable performance of low-noise amplifiers (LNAs) and/or multi-throw RF switches in silicon-on-insulator technology can enable a stacked transistor silicon-on-insulator power amplifier to be implemented as part of a complete front end integrated circuit (FEIC) solution that includes transmit, receive, and switching functionality with desirable performance.

For example, in some embodiments the front end system 10 can be a packaged module including a semiconductor-on-insulator die implementing a FET-based class-F power amplifier 5 and an output matching network 9. Further details regarding such embodiments, and exemplary output matching networks are described in further detail herein, such as with respect to FIGS. 2 and 3, for example.

As shown in FIG. 1A, the front end system 10 includes multiple signal paths between the antenna-side switch 2 and the transceiver-side switch 3. For example, the illustrated front end system 10 includes a bypass signal path that includes the bypass circuit 4, a transmit signal path that includes the power amplifier 5, and a receive signal path that includes the LNA 6. Although an example with three signal paths is shown, a front end system can include more or fewer signal paths.

The antenna-side switch 2 is used to control connection of the signal paths to an antenna (not shown in FIG. 1A). For example, the antenna-side switch 2 can be used to connect a particular one of the transmit signal path, the receive signal path, or the bypass signal path to an antenna. Additionally, the transceiver-side switch 3 is used to control connection of the signal paths to a transceiver (not shown in FIG. 1A). For example, the transceiver-side switch 3 can be used to connect a particular one of the transmit signal path, the receive signal path, or the bypass signal path to a transceiver. In certain implementations, the antenna-side switch 2 and/or the transceiver-side switch 3 are implemented as multi-throw switches.

Figure 1B:
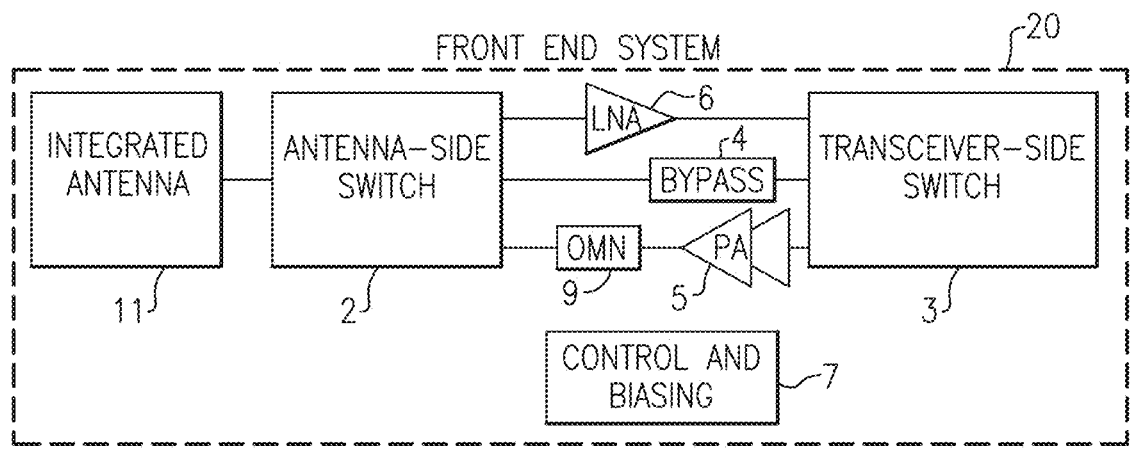
FIG. 1B illustrates a schematic block diagram of another example of a front end system.

FIG. 1B illustrates a schematic block diagram of another example of a front end system 20. The front end system 20 of FIG. 1B is similar to the front end system 10 of FIG. 1A, except that the front end system 20 further includes an integrated antenna 11. In certain implementations, a front end system includes an integrated antenna. For example, a front end system can be implemented on a module along with one or more integrated antennas.

With reference to FIGS. 1A and 1B, the bypass network 4 can include any suitable network for matching and/or bypassing the receive signal path and the transmit signal path. The bypass network 4 can be implemented, for instance, by a passive impedance network or by a conductive trace or wire.

The power amplifier 5 can be used to amplify a transmit signal received from a transceiver for transmission via an antenna. The power amplifier 5 can be implemented in a wide variety of ways.

Figure 3:
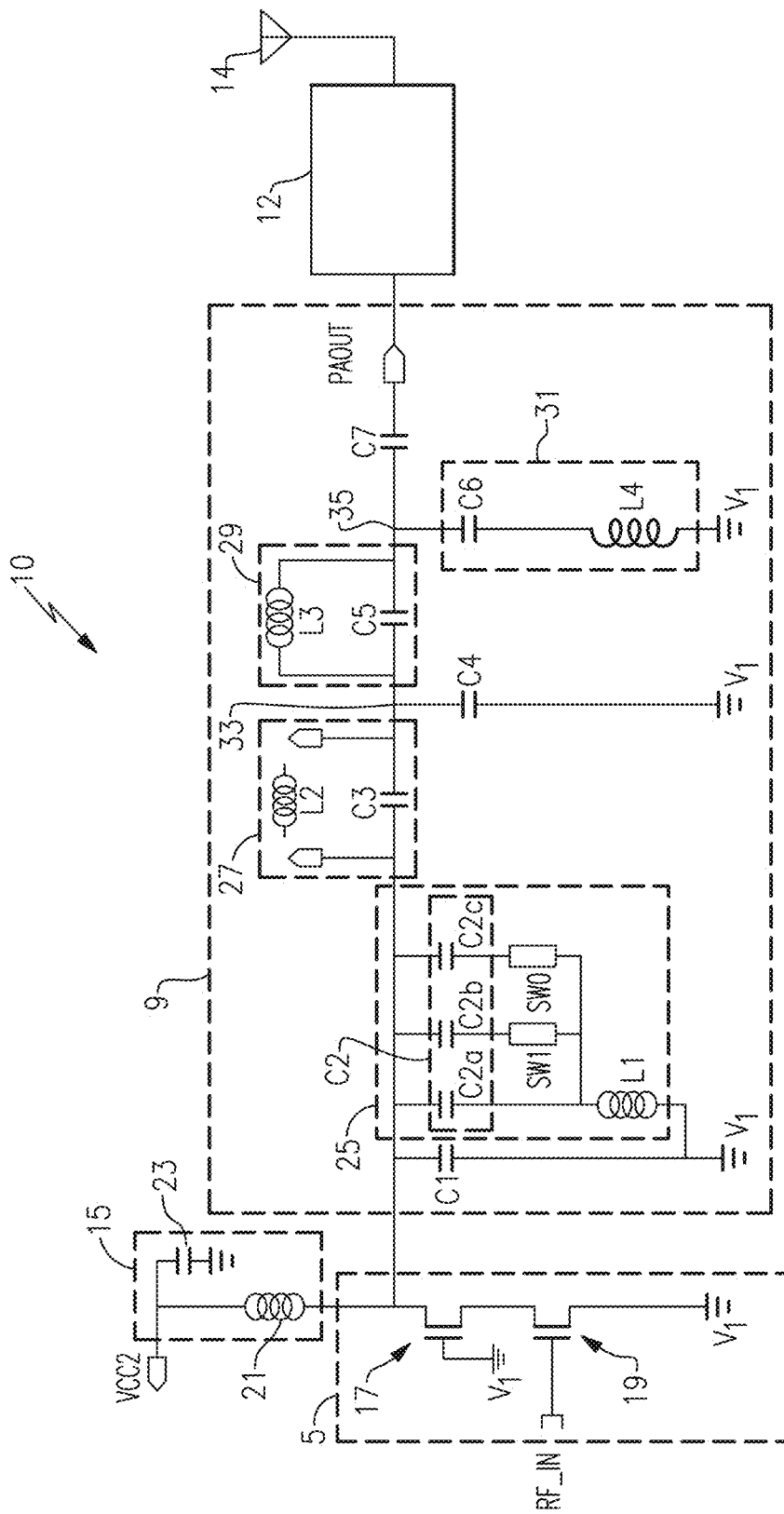
FIG. 3 is a schematic diagram showing portions of a transmit path of a front end system including another example of an output matching network.

In certain implementations, the power amplifier 5 is a class F amplifier including two field-effect transistors implemented in a cascode arrangement (see, e.g., FIG. 3). Such a stacked power amplifier topology can be advantageous in semiconductor-on-insulator process technologies. For instance, device stacking for silicon-on-insulator power amplifier circuit topologies can overcome relatively low breakdown voltages of scaled transistors. Such device stacking can be beneficial in applications in which a stacked amplifier is exposed to a relatively large voltage swing, such as a voltage swing exceeding about 2.75 Volts. Stacking several transistors, such as 2, 3, 4 or more transistors, can result in a power amplifier with desirable operating characteristics.

In additional embodiments, the power amplifier 5 can include a stacked output stage and a bias circuit that biases the stacked transistors of the stacked output stage based on mode. In one example, the bias circuit can bias a transistor in a stack to a linear region of operation in a first mode, and bias the transistor as a switch in a second mode. Accordingly, the bias circuit can bias the stacked output stage such that the stacked output stage behaves like there are fewer transistors in the stack in the second mode relative to the first mode. Such operation can result in meeting design specifications for different power modes, in which a supply voltage provided to the stacked output stage changes based on mode.

In certain implementations, the power amplifier 5 can include a driver stage implemented using an injection-locked oscillator and an output stage having an adjustable supply voltage that changes with a mode of the power amplifier 5. By implementing the power amplifier 5 in this manner, the power amplifier 5 exhibits excellent efficiency, including in a low power mode. For example, in the low power mode, the adjustable supply voltage used to power the output stage is decreased, and the driver stage has a relatively large impact on overall efficiency of the power amplifier 5. By implementing the power amplifier 5 in this manner, the power amplifier's efficiency can be enhanced, particularly in applications in which the power amplifier's output stage operates with large differences in supply voltage in different modes of operation.

The LNA 6 can be used to amplify a received signal from the antenna. The LNA 6 can be implemented in a wide variety of ways.

In some embodiments, the LNA 6 is implemented with magnetic coupling between a degeneration inductor (e.g., a source degeneration inductor or an emitter degeneration inductor) and a series input inductor. These magnetically coupled inductors can in effect provide a transformer, with a primary winding in series with the input and a secondary winding electrically connected where the degeneration inductor is electrically connected to the amplifying device (e.g., at the source of a field effect transistor amplifying device or at the emitter of a bipolar transistor amplifying device). Providing magnetically coupled inductors in this manner allows the input match inductor to have a relatively low inductance value and corresponding small size. Moreover, negative feedback provided by the magnetically coupled inductors can provide increased linearity to the LNA 6.

In certain embodiments, the LNA 6 and the antenna-side switch 2 are implemented in accordance with one or more features of Section II (Overload Protection of Low Noise Amplifier). For example, the antenna-side switch 2 can include an analog control input for controlling an impedance between an antenna and an input to the LNA 6. Additionally, an overload protection circuit is included to provide feedback to the switch's analog control input based on detecting a signal level of the LNA 6. Thus, the overload protection circuit detects whether or not the LNA 6 is overloaded. Additionally, when the overload protection circuit detects an overload condition, the overload protection circuit provides feedback to the analog control input of the switch to increase the impedance of the switch and reduce the magnitude of the input signal received by the LNA 6. Implementing the LNA 6 and the antenna-side switch 2 in this manner limits large current and/or voltage swing conditions manifesting within amplification transistors of the LNA 6.

With continuing reference to FIGS. 1A and 1B, the control and biasing circuit 7 can be used to control and bias various front end circuitry. For example, the control and biasing circuit 7 can receive control signal(s) for controlling the LNA 6, the antenna-side switch 2, the transceiver-side switch 3, and/or the power amplifier 5. The control signals can be provided to the control and biasing circuit 7 in a variety of ways, such as over an input pad of a die. In one example, the control signals include at least one of a mode signal or a bias control signal.

The front end system 10 of FIG. 1A and the front end system 20 of FIG. 1B can be implemented on one or more semiconductor dies. In certain implementations, at least one of the semiconductor dies includes pins or pads protected using an electrical overstress (EOS) protection circuit. For example, an EOS protection circuit can include an overstress sensing circuit electrically connected between a pad of a semiconductor die and a first supply node, an impedance element electrically connected between the pad and a signal node, a controllable clamp electrically connected between the signal node and the first supply node and selectively activatable by the overstress sensing circuit, and an overshoot limiting circuit electrically connected between the signal node and a second supply node. The overstress sensing circuit activates the controllable clamp when an EOS event is detected at the pad. Thus, the EOS protection circuit is arranged to divert charge associated with the EOS event away from the signal node to provide EOS protection. By implementing a front end system in this manner can achieve enhanced EOS protection, lower static power dissipation, and/or a more compact chip layout. In certain implementations, the pad is an input pad that receives a control signal for controlling the power amplifier 5 and/or LNA 6.

In accordance with certain embodiments, the front end systems of FIGS. 1A and/or 1B can include RF shielding and/or RF isolation structures. For example, the front end system can be implemented as a radio frequency module that is partially shielded. Additionally, a shielding layer is included over a shielded portion of the radio frequency module and an unshielded portion of the radio frequency module is unshielded. The shielding layer can shield certain components of the front end system (for instance, the power amplifier 5 and/or LNA 6) and leave other components (for instance, the integrated antenna 11) unshielded.

In certain implementations, the front end systems of FIGS. 1A and/or 1B can include a laminated substrate including an antenna is printed on a top layer and a ground plane for shielding on a layer underneath the top layer. Additionally, at least one electronic component of the front end can be disposed along a bottom layer of the laminate substrate, and solder bumps are disposed around the electronic component and electrically connected to the ground plane. The solder bumps can attach the module to a carrier or directly to a system board. The electronic component can be surrounded by solder bumps, and the outside edges of the electronic component can have ground solder bumps that are connected to the ground plane by way of vias. Accordingly, a shielding structure with can be completed when the module is placed onto a carrier or system board, and the shielding structure can serve as a Faraday cage around the electronic component.

In certain embodiments, the front end systems disclosed herein are implemented on a semiconductor die as front end integrated circuit (FEIC). The FEIC can be included in a packaged module that stacks multiple chips and passive components, such as capacitors and resistors, into a compact area on a package substrate. By implementing an FEIC in such a packaged module, a smaller footprint and/or a more compact substrate area can be achieved.

In accordance with certain embodiments, a packaged module includes a FEIC, a crystal oscillator and a system on a chip (SoC), such as a transceiver die. The SoC can be stacked over a crystal assembly to save space and provide shorter crystal traces. The crystal assembly includes the crystal oscillator housed in a housing that includes one or more conductive pillars for routing signals from the SoC to a substrate and/or to provide thermal conductivity.

In accordance with certain embodiments, a packaged module includes a FEIC, a filter assembly and a SoC. For example, the filter assembly can be stacked with other dies and components of the packaged module to reduce a footprint of the packaged module. Furthermore, stacking the filter assembly in this manner can reduce lengths of signal carrying conductors, thereby reducing parasitics and enhancing signaling performance.

A system in a package (SiP) can include integrated circuits and/or discrete components within a common package. Some or all of a front end system can be implemented in a SiP. An example SiP can include a system-on-a-chip (SoC), a crystal for clocking purposes, and a front-end module (FEM) that includes a front end system. In certain SiPs, a SoC and a crystal can consume a relatively large amount of physical area. This can create a relatively large footprint for the SiP.

Power Amplifier Output Matching

Figure 2:
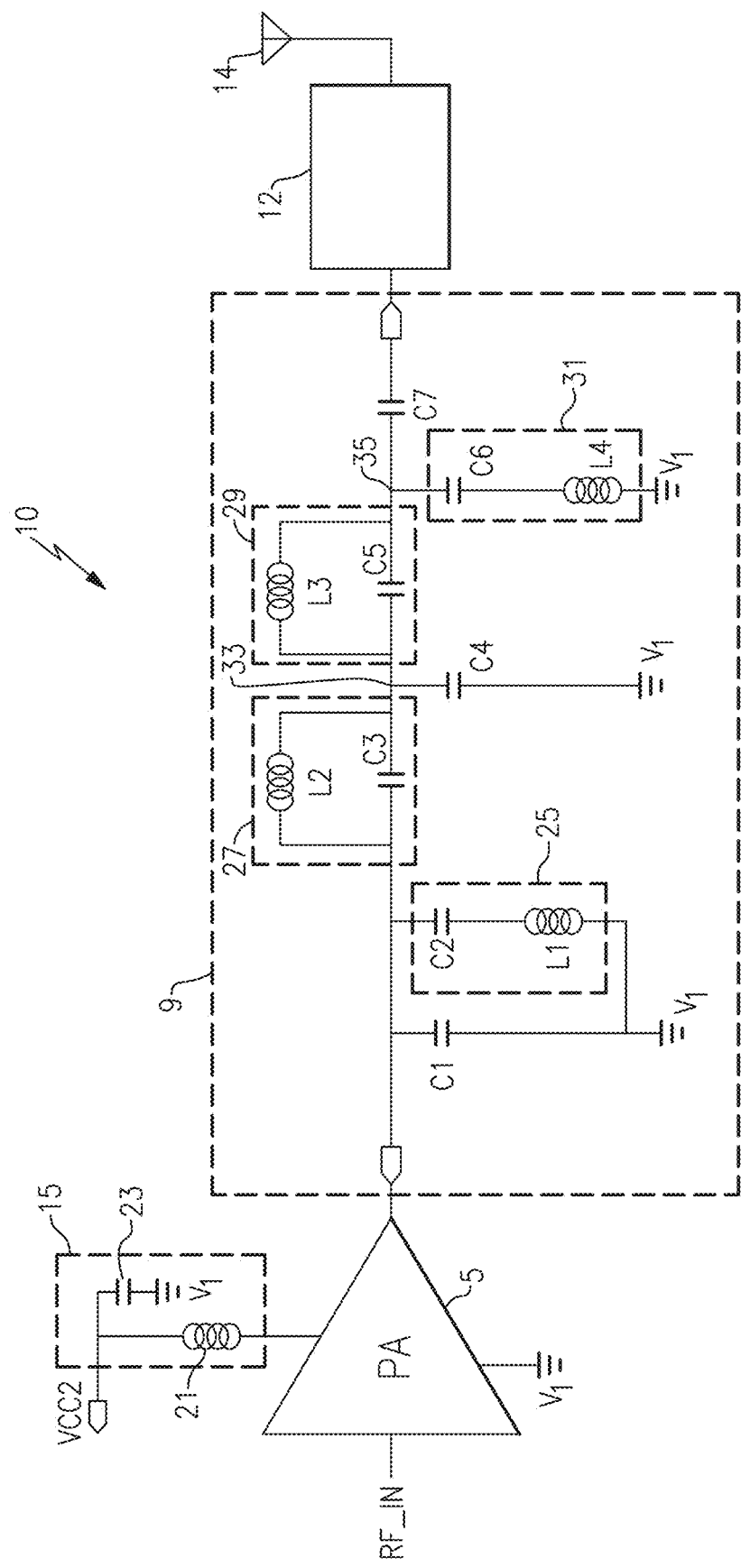
FIG. 2 is a schematic diagram showing portions of a transmit path of a front end system including an example of an output matching network.

FIG. 2 is a schematic diagram showing portions of transmit path of a power amplifier front end 10, including a power amplifier 5, a supply voltage biasing circuit 15, an output matching circuit 9 (also referred to as an output matching network), and at least one RF front end component 12. For example, the front end component 12 can include a switch such as the antenna-side switch 2 of FIG. 1A/1B, which connects the transmit path to an antenna 14, which can either be integrated together with the front end 10 (e.g., FIG. 1B) or external to the front end 10 (e.g., FIG. 1A).

The power amplifier 5 includes an input configured to receive a radio frequency signal RF_IN and an output electrically connected to an input node of the output matching circuit 9. The output matching circuit 9 further includes an output node electrically connected to an input of the RF front end component 12. The RF front end component 12 include an output electrically connected to the antenna 14.

The illustrated power amplifier 5 can include one or more field effect transistors implemented in a semiconductor-on-insulator die, one example of which is depicted in FIG. 3. Referring to FIGS. 2 and 3, the power amplifier illustrated in FIG. 3 includes first and second field effect transistors (FETs) 17, 19 connected in a stacked cascade configuration.

For example, the first and second FETs 17, 19 can be semiconductor-on-insulator (e.g., silicon-on-insulator) transistors. Each FET includes a gate, drain, and source. The first FET 17 is connected in a common-gate configuration with the gate electrically connected to a power low supply voltage $V_1$, which can be a ground supply. The source of the first FET 17 is connected to the drain of the second FET 19. The second FET 19 is connected in a common-source configuration, with the source connected to the first power low supply voltage $V_1$. The gate of the second FET 19 is configured to receive the signal RF_IN. During operation, the power amplifier 5 can amplify the signal RF_IN, and provide the amplified signal at the drain of the first FET 17, which operates as the output of the power amplifier 5. The first and second FETs 17, 19 can be any suitable FET devices. Although FIG. 3 illustrates one implementation of the power amplifier 5, the teachings described herein can be applied to a variety of power amplifier structures, including, for example, multi-stage power amplifier structures and/or power amplifiers employing other transistor types, including, for example, bipolar transistors.

The power amplifier 5 in certain embodiments is a class F power amplifier. This can be advantageous in implementations where the power amplifier 5 is implemented in a semiconductor-on-insulator complementary metal oxide semiconductor (CMOS) process technology, or other CMOS process technology, because CMOS process technologies can have limited voltage handling capabilities as compared to other process technologies (e.g., Gallium Arsenide), and class F amplifiers can be well-suited under these circumstances. In other embodiments, other types of amplifiers such as class AB, inverted class F, or class E can be used.

Particularly where a class F amplifier is used, it can be desirable for the output matching circuit 9 to implement an effective second order harmonic short circuit and third order harmonic open circuit. Thus, the output matching circuits 9 of FIGS. 2 and 3 can be configured to provide enough rejection on the second and third order harmonics.

Referring to FIGS. 2 and 3, the output of the power amplifier 5 and the input of the output matching circuit 9 are connected to the supply voltage biasing circuit 15. As shown in FIG. 3, the supply voltage biasing circuit 15 can be electrically connected between the power high supply voltage $V_{CC}$ and the input node of the output matching network 9. The supply voltage biasing circuit 15 can be used to bias the power amplifier 5 with the power high supply voltage $V_{CC}$, which in certain implementations is generated by an envelope tracker or other supply control block. The supply voltage biasing circuit 15 includes an inductor 21 and a capacitor 23. The inductor can be referred to as a choke inductor 21 and includes a first end electrically connected to the power high supply voltage $V_{CC}$ and a second end electrically connected to the drain of the first FET 17 at the output of the power amplifier 5. The choke inductor 21 can have an inductance sufficient to block RF signals generated by the power amplifier 5 from reaching the power high supply voltage $V_{CC}$. However, the choke inductor 21 should be sized to minimize $L*dI/dt$ effects associated with receiver band noise, which can degrade performance in envelope tracking applications. The capacitor 23 can be referred to as a decoupling capacitor 23 and includes a first end electrically connected to the power high supply voltage $V_{CC}$ and a second end electrically connected to the power low supply voltage $V_1$, and can perform a wide variety of functions. For example, including the decoupling capacitor 23 can reduce noise of the power high supply voltage $V_{CC}$ and/or stabilize the output of the power amplifier 5. Additionally, the decoupling capacitor 23 can be used to provide an RF/AC ground to the second end of the choke inductor 21.

The choke inductor 21 in some embodiments is not implemented on the same die as the other components shown in FIG. 2. For instance, in one embodiment the choke inductor 21 is embedded in metal layers of a module laminate or substrate, as is further described with respect to FIG. 4. Such an embedded inductor can provide improved current handling. In another embodiment, the choke inductor 21 is implemented on the same die as other components illustrated in FIG. 2, such as the power amplifier, output matching network, and front end component 12. In yet another embodiment the choke inductor 21 is a surface mount component.

In various embodiments, the choke inductor 21 has an inductance in the range of about 1 nH to about 6 nH and the decoupling capacitor 23 has a capacitance in the range of about 0 nF (omitted) to about 5 nF. In one embodiment, the choke inductor 21 has an inductance of 1.1 nH and the decoupling capacitor 23 has a capacitance of 2.7 nF. However, other suitable inductance and capacitance values can be used, such as inductance and capacitance values associated with optimum load impedance and/or operating frequency.

The output matching network 9 includes first and second matching capacitors C1, C4, first and second second-order harmonic short circuits 25, 31, a third-order harmonic open circuit 27, a second order harmonic rejection circuit 29, and a DC blocking capacitor C7.

The first matching capacitor C1 and the second first second-order harmonic short circuit 25 are each electrically connected between the input node of the output matching network 9 and the power low supply voltage $V_1$. The third-order harmonic open circuit 27 is connected between the input node of the output matching network 9 and the first node 33. The second matching capacitor C4 is connected between the first node 33 and the power low supply voltage $V_1$. The second order harmonic open circuit 29 is connected between the first node 33 and a second node 35. The second second-order harmonic short circuit 31 is connected between the second node 35 and the power supply low node $V_1$. The DC blocking capacitor is connected between the second node 35 and the output node of the output matching network 9.

The first and second matching capacitors C1, C4 can be configured to match impedance of the output of the power amplifier 5.

The first and second second-order harmonic short circuits 25, 31 can be configured to resonate at about two times the fundamental frequency of the signal RF_IN so as to short second-order harmonic frequency signal components in the power amplifier's output signal. In the illustrated configuration, the first second-order harmonic short circuit 25 includes an inductor L1 and a capacitor C2 electrically connected in series between the power low supply voltage $V_1$ and the input node of the output matching network 9, which is also the output of the power amplifier 5 and, referring now only to FIG. 3, the drain of the first FET 17. The second second-order harmonic short circuit 31 includes an inductor L4 and a capacitor C6 electrically connected in series. Although the first and second second-order harmonic short circuits 25, 31 illustrate exemplary configurations, other configurations can be used, including, for example, implementations in which the order of the inductors and the capacitors in the series are reversed.

In one embodiment, the first second-order harmonic short circuit 25 is configured to resonate such that the impedance of the first second-order harmonic series resonant circuit 25 at two times the fundamental frequency of the signal RF_IN is less than about 1Ω. The first second-order harmonic short circuit 25 can be configured to resonate such that the impedance of the first second-order harmonic series resonant circuit 25 at two times the fundamental frequency of the signal RF_IN is less than about 20% of a load line impedance (e.g., a 5Ω load line impedance) of the output matching circuit 9.

The third-order harmonic open circuit 27 includes a capacitor C3 and an inductor L2 connected in parallel. The third-order harmonic open circuit 27 can be configured to resonate at about three times the fundamental frequency of the signal RF_IN and act as an open circuit, thereby blocking third-order harmonic frequency components generated by the output signal of the power amplifier 5 from reaching the first node 33.

The third-order harmonic open circuit 27 can improve the third-order harmonic rejection of the power amplifier 5 by providing high impedance to signals at about three times the fundamental frequency of the signal RF_IN. In one embodiment, the inductor L2 and the capacitor C3 are configured to resonate such that the impedance of the third-order harmonic parallel resonant circuit 27 at three times the fundamental frequency of the signal RF_IN is greater than about 50 kΩ. The inductor L2 and the capacitor C3 can be configured to resonate such that the impedance of the third-order harmonic open circuit 27 at three times the fundamental frequency of the signal RF_IN is greater than about 10000 times a load line impedance (e.g., a 5Ω load line impedance) of the output matching circuit 9.

The second order harmonic open circuit 29 includes a capacitor C5 and an inductor L3 connected in parallel. The second order harmonic open circuit 29 is configured to resonate at about two times the fundamental frequency of the signal RF_IN and act as an open circuit, thereby blocking second-order harmonic frequency components generated by the output signal of the power amplifier 5 from reaching the second node 33. Thus, the second order harmonic open circuit 29 serves to supplement the second order harmonic rejection provided by the first and second second-order harmonic short circuits 25, 31.

The output matching circuit 9 further includes the DC blocking capacitor C7, which is electrically connected between the second node 35 and the output node of the output matching circuit 9. The DC blocking capacitor C7 can provide DC blocking and/or help provide an impedance transformation to achieve a desired load line impedance of the power amplifier 5 at the fundamental frequency. For example, in certain implementations the DC blocking capacitor C7 can be used at least in part to transform a termination impedance associated with the RF front end 10, such as a 50Ω termination impedance, to a load line impedance that is desirable for the power amplifier 5 from a power efficiency standpoint. Additionally, the DC blocking capacitor C7 can block DC signals, thereby helping to provide DC bias voltage isolation between the output of the power amplifier 5 and the input of the RF front end 10. Although FIGS. 2 and 3 illustrate a configuration including the DC blocking capacitor C7, in certain implementations the DC blocking capacitor C7 can be omitted, such as in implementations using a surface acoustic wave (SAW) filter.

Although the output matching circuit 9 has been illustrated in the context of one example of a power amplifier system, the output matching circuit 9 can be used in other configurations of power amplifier systems.

Referring now only to FIG. 3, the illustrated embodiment shows an implementation in which the capacitor C2 is implemented using a tunable bank of three switched capacitors C2a, C2b, C2c instead of the single capacitor C2 shown in the implementation of FIG. 2. The switches SW1 and SW0 are connected in series with the capacitors C2b and C2c respectively, such that the overall capacitance of C2 can be tuned. In particular, the overall capacitance can be tuned to one of three values: 1) C2a (where SW1 and SW0 are both off/open); 2) C2a+C2b (where SW1 is on/closed, SW0 is off/open); or 3) C2a+C2b+C2c (where SW1 and SW0 are both on/closed). In this manner, the front end 10 can dynamically adjust the output matching network to optimize the second order rejection provided by the first second-order short circuit 25.

While only the first second-order short circuit 25 is shown as having a dynamically adjustable capacitance value, any combination of one or more of the other capacitance or inductor values can be similar dynamically adjustable, e.g., by incorporating additional capacitors, inductors, and corresponding switches, as appropriate.

FIG. 3 shows the inductor L2 being implemented as an off-die component instead, not included on the same die as the other components of the output matching network 9. For instance, the inductor L2 can be a surface mount component mounted on a substrate of a module. Behavior or the output matching network 9 can be particularly sensitive to the precise value of L2, and a surface mount implementation of L2 can reduce the cost of selecting/adjusting the value of L2 as needed. While only L2 is shown as being a surface mount component in FIG. 3, any of the other capacitors or inductors can be surface mount components in other embodiments. In some embodiments, L2 is included on the same die (e.g., a semiconductor-on-insulator die) as the other components of the output matching network 9.

Figure 4:
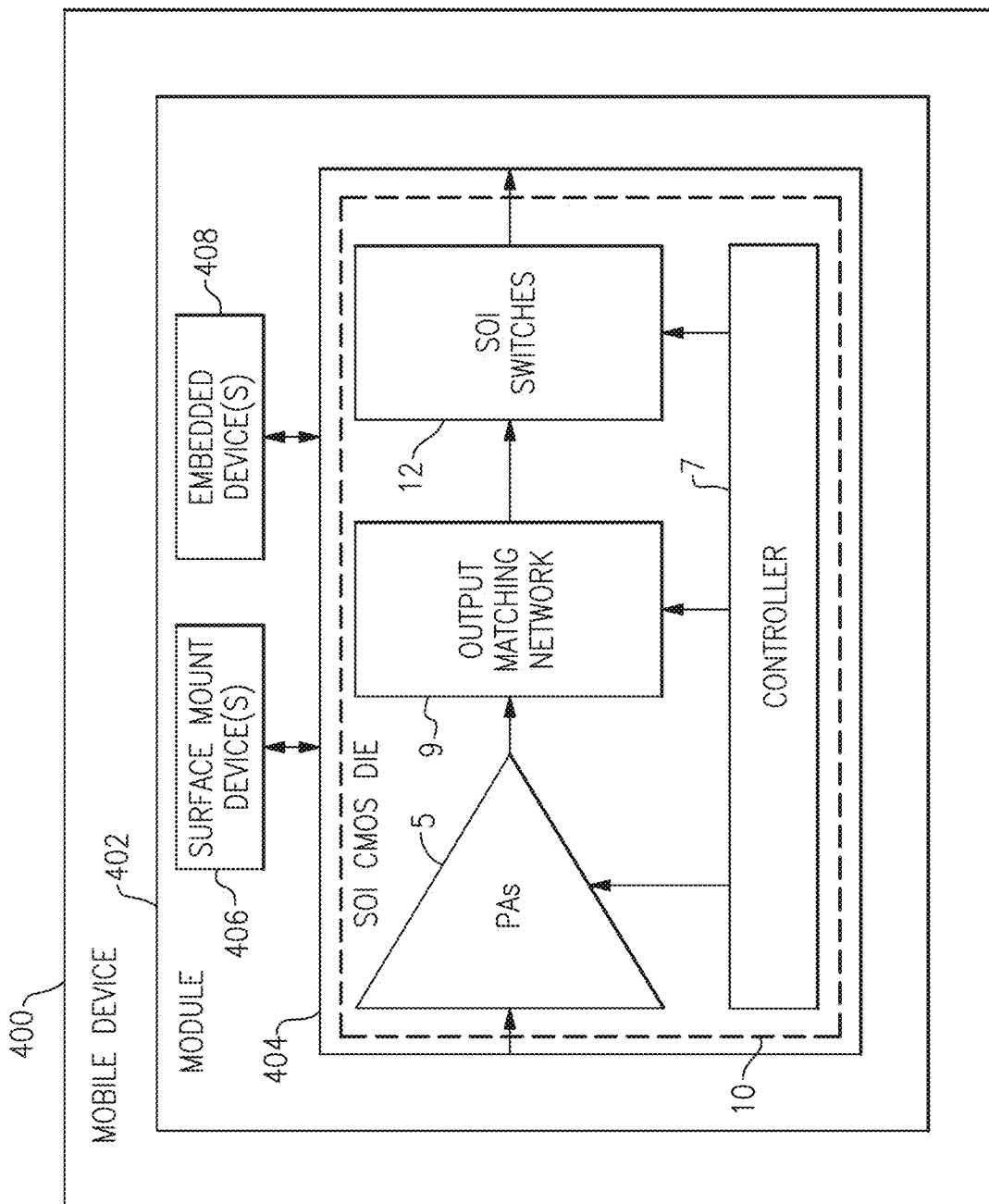
FIG. 4 depicts an example of a mobile device including a radio frequency module having a semiconductor-on-insulator die.

FIG. 4 depicts an example of a mobile device 400 including a radio frequency module 402 having a semiconductor-on-insulator die 404. As shown, the semiconductor-on-insulator die can include a front end system 10, which can be any of the front end systems described herein including those described previously with respect to FIGS. 1A-3. The mobile device 400 can be an Internet of Things (IoT) capable device, for example. Additional details regarding compatible IoT networks and devices are provided herein, including in the section entitled Internet of Things Applications. The mobile device 400 of FIG. 4 can comprise or be incorporated into any of the IoT devices described in that section or elsewhere herein. In other embodiments, the mobile device 400 is a mobile phone The front end system 10 includes one or more power amplifiers 5, an output matching network 9, one or more switches, and a controller 7. The power amplifiers 5 can be similar to or the same as the similarly numbered power amplifiers in FIGS. 1-3, and can in some embodiments be a cascode FET-based class F amplifier such as the power amplifier 5 of FIG. 3. The output matching network 9 is configured to increase the power transfer and/or reduce reflections of the amplified RF signal generated by the power amplifier 5, and can be any of the output matching networks described herein. The switch 12 can include one or more of the antenna-side switch 2 and transceiver-side switch 3 of FIGS. 1A-1B, or the RF component 12 of FIGS. 2-3. The controller 7 can be similar to or the same as the control and biasing circuit 7 of FIGS. 1A-1B, and can be used to control and bias the components of the front-end system 10. As one example, the controller 7 can include the biasing circuit 15 of FIGS. 2-3, and can be configured to control the switches SW0, SW1 of FIG. 3 to tune the capacitance C2.

While not shown in FIG. 4, the front end system 10 can include additional components, such as one or more LNAs, additional switches, bypass circuitry, or the like.

The module 402 can include one or more surface mount devices 406 mounted on the module substrate, and one or more embedded devices 408 embedded in metal layers of a laminate substrate of the module 402. The surface mount devices 406 and embedded devices 408 can include inductors, capacitors, or other electrical components. For example, referring to FIG. 3, the surface mount devices 406 can include the inductor L2, and the embedded devices 408 can include the choke inductor 21.

In one embodiment, the module 400 implements at least a LTE-M communication standard and incorporates a CMOS silicon-on-insulator die 404, eight surface mount devices 406 including the inductor L2, and one embedded device comprising the choke inductor L1.

While not shown, the module 406 can include additional components, including some or all of a transceiver, baseband processor, memory, antenna, and the like (see, e.g., FIGS. 13A-15). Moreover, in some embodiments the mobile device 400 includes one or more additional modules or other components not shown in FIG. 4, which can implement one or more of a transceiver, baseband processor, memory, antenna, or other appropriate componentry.

According to certain embodiments, the use of a semiconductor-on-insulator (e.g., silicon-on-insulator CMOS) process technology allows for the incorporation on a single die 404 multiple functional elements, whereas other previous solutions utilize multiple dies of different process technologies. Such single-die configurations can be particularly well-suited for Internet of Things applications and corresponding communication technologies.

The mobile devices and corresponding front end systems described herein can implement a variety of communication standards including LTE-M (LTE Machine Type Communication), Bluetooth, ZigBee, Z-Wave, 6LowPAN, Thread, Wi-Fi, NFC, Sigfox, Neul, and/or LoRaWAN technologies. Furthermore, according to certain embodiments the mobile devices and corresponding front end systems can be configured to communicate using cellular infrastructure, for instance, using 2G, 3G, 4G (including LTE, LTE-Advanced, and/or LTE-Advanced Pro), and/or 5G technologies.

Packaged Modules

Figure 5A:
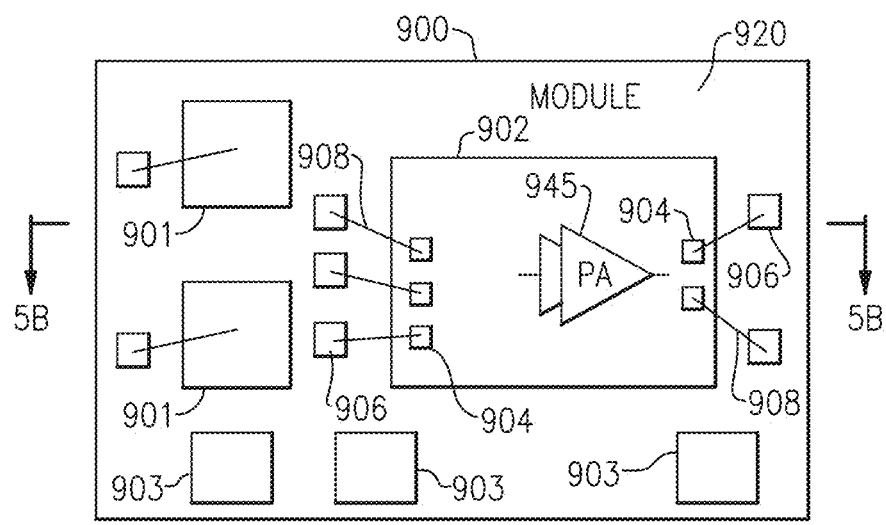
FIG. 5A is a schematic diagram of one embodiment of a packaged module.
Figure 5B:
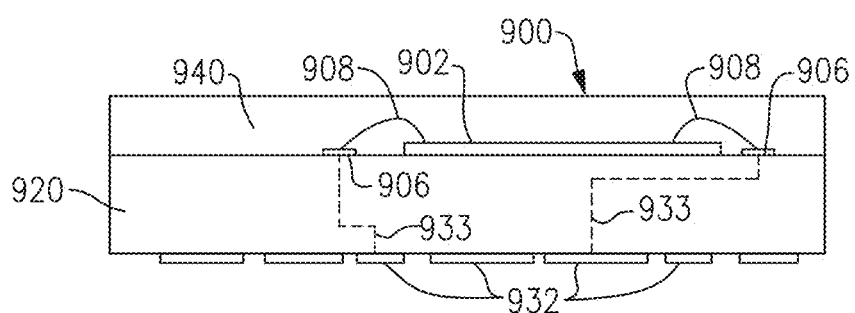
FIG. 5B is a schematic diagram of a cross-section of the packaged module of FIG. 5A taken along the lines 5B-5B.

FIG. 5A is a schematic diagram of one embodiment of a packaged module 900 which can incorporate any of the front end systems described herein or otherwise be incorporated into any of the mobile devices included herein. For example, the module 900 may correspond to the module 400 of FIG. 4. FIG. 5B is a schematic diagram of a cross-section of the packaged module 900 of FIG. 5A taken along the lines 5B-5B.

The packaged module 900 includes radio frequency components 901, a semiconductor die 902, surface mount devices 903, wirebonds 908, a package substrate 920, and an encapsulation structure 940. For example, the semiconductor die 902 can be the semiconductor die 404 of FIG. 4, and can incorporate the front end systems 10 of FIG. 1A, 2, or 3, the front end system 20 of FIG. 1B. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a power amplifier 945, which can be implemented in accordance with one or more features disclosed herein. While only the power amplifier 945 is shown for simplicity, it will be appreciated that additional componentry including any of the output matching networks, LNAs, switches, controllers, and the like can be included.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 5B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 5B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Internet of Things Applications

As mentioned previously, one example application of the front end systems herein is to enable various objects with wireless connectivity, such as for Internet of things (IoT). IoT refers to a network of objects or things, such as devices, vehicles, and/or other items that are embedded with electronics that enable the objects to collect and exchange data (for instance, machine-to-machine communications) and/or to be remotely sensed and/or controlled. The front end systems herein can be used to enable wireless connectivity of various objects, thereby allowing such objects to communicate in an IoT network. The front end systems discussed herein can be implemented in IoT applications to enable wireless connectivity to expand the way consumers manage information and their environment. Such front end systems can enable the new and emerging IoT applications, which can bring people and things closer to vital information wherever it is desired. Although IoT is one example application of front end systems herein, the teachings herein are applicable to a wide range of technologies and applications. Some example IoT applications will now be discussed.

IoT devices can be implemented in automotive systems. From telematics to infotainment systems, lighting, remote keyless entry, collision avoidance platforms, toll transponders, video displays, vehicle tracking tools, and the like, front end systems in accordance with any suitable principles and advantages discussed herein can help enable convenience and safety features for the connected vehicle.

IoT devices can be implemented in connected home environments. Front end systems in accordance with any suitable principles and advantages discussed herein can allow homeowners greater control over their home environment. IoT devices can be implemented in a host of devices including smart thermostats, security systems, sensors, light switches, smoke and carbon monoxide alarms, routers, high definition televisions, gaming consoles and much more.

IoT devices can be implemented in industrial contexts. From smart city applications to factory automation, building controls, commercial aircraft, vehicle tracking, smart metering, LED lighting, security cameras, and smart agriculture functions, front ends systems in accordance with any suitable principles and advantages discussed herein can enable these applications and meet specifications.

IoT devices can be implemented in machine-to-machine contexts. IoT devices can enable machine-to-machine communications that can transform the way organizations do business. From manufacturing automation to telemetry, remote control devices, and asset management, front end systems discussed herein can provide cellular, short-range, and global positioning solutions that support a wide range of machine-to-machine applications.

IoT devices can be implemented in medical applications. Front end systems in accordance with any suitable principles and advantages discussed herein can enable medical devices and the communication of information that is improving the care of millions of people worldwide. Front end systems in accordance with any suitable principles and advantages discussed herein can be integrated into product designs that enable the miniaturization of medical devices and enhance data transmission. Amplifiers, such as power amplifiers and low noise amplifiers, in accordance with any suitable principles and advantages discussed herein can be implemented in medical instruments.

IoT devices can be implemented in mobile devices. The communication landscape has changed in recent years as consumers increasingly seek to be connected everywhere and all the time. Front end systems in accordance with any suitable principles and advantages discussed herein can be compact, energy and cost efficient, meeting size and performance constraints, while enabling a great consumer experience. Wireless mobile devices, such as smartphones, tablets and WLAN systems, can include a front end system in accordance with any suitable principles and advantages discussed herein.

IoT devices can be implemented in smart energy applications. Utility companies are modernizing their systems using computer-based remote control and automation that involves two-way communication. Some benefits to utilities and consumers include optimized energy efficiency, leveling and load balancing on the smart grid. Front end systems in accordance with any suitable principles and advantages discussed herein can be implemented in smart meters, smart thermostats, in-home displays, LTE-M (LTE Machine Type Communication), ZigBee/802.15.4, Bluetooth, and Bluetooth low energy applications.

IoT devices can be implemented in wearable devices. Wearable devices, such as smartwatches, smart eyewear, fitness trackers and health monitors, can include front end systems in accordance with any suitable principles and advantages discussed herein to enable relatively small form factor solutions that consume relatively low power and enable always on connectivity. This can allow applications to run in the background for lengthy periods of time without a battery recharge, for example.

Any suitable principles and advantages discussed herein can implemented in an IoT network, IoT object, a vehicle, industrial equipment, a corresponding front end system, a corresponding circuit board, the like, or any suitable combination thereof. Some examples will now be discussed.

Figure 6:
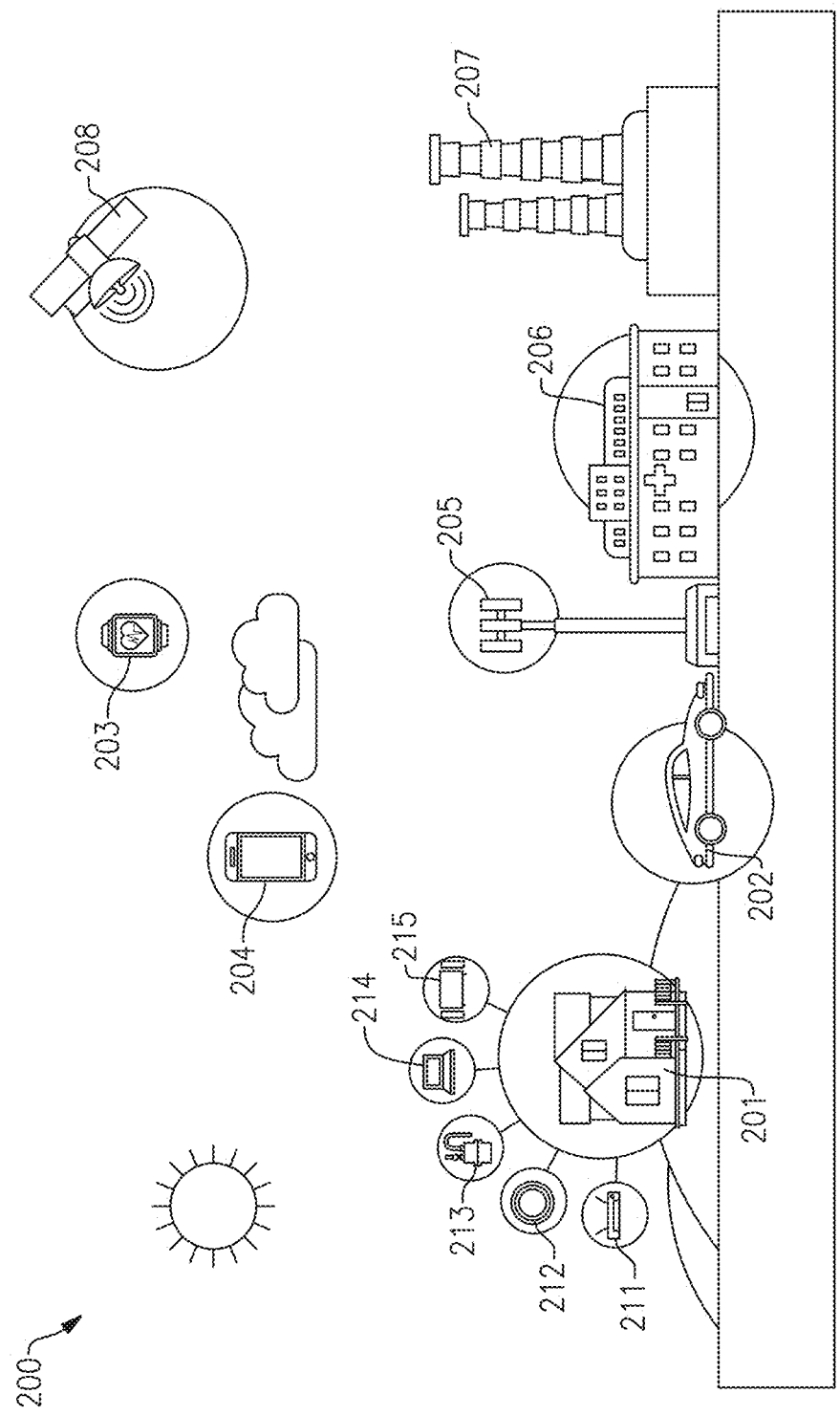
FIG. 6 is a schematic diagram of one example of an Internet of things (IoT) network.

FIG. 6 is a schematic diagram of one example of an IoT network 200. The IoT network 200 includes a smart home 201, a smart vehicle 202, a wearable 203, a mobile device 204, a base station 205, a smart hospital 206, a smart factory 207, and a smart satellite 208. One or more of the IoT-enabled objects of FIG. 6 can include a front end system, such as a front end module and/or front-end integrated circuit, implemented in accordance with the teachings herein.

The smart home 201 is depicted as including a wide variety of IoT-enabled objects, including an IoT-enabled router 211, an IoT-enabled thermostat 212, an IoT-enabled meter 213, IoT-enabled laptop 214, and an IoT-enabled television 215. Although various examples of IoT-enable objects for a smart home are shown, a smart home can include a wide variety of IoT-enabled objects. Examples of such IoT-enabled objects include, but are not limited to, an IoT-enabled computer, an IoT-enabled laptop, an IoT-enabled tablet, an IoT-enabled computer monitor, an IoT-enabled television, an IoT-enabled media system, an IoT-enabled gaming system, an IoT-enabled camcorder, an IoT-enabled camera, an IoT-enabled modem, an IoT-enabled router, an IoT-enabled kitchen appliance, an IoT-enabled telephone, an IoT-enabled air conditioner, an IoT-enabled washer, an IoT-enabled dryer, an IoT-enabled copier, an IoT-enabled facsimile machine, an IoT-enabled scanner, an IoT-enabled printer, an IoT-enabled scale, an IoT-enabled home assistant (for instance, a voice-controlled assistant device), an IoT-enabled security system, an IoT-enabled thermostat, an IoT-enabled smoke detector, an IoT-enabled garage door, an IoT-enabled lock, an IoT-enabled sprinkler, an IoT-enabled water heater, and/or an IoT-enabled light.

As shown in FIG. 6, the smart vehicle 202 also operates in the IoT network 200. The smart vehicle 202 can include a wide variety of IoT-enabled objects, including, but not limited to, an IoT-enabled infotainment system, an IoT-enabled lighting system, an IoT-enabled temperature control system, an IoT-enabled lock, an IoT-enabled ignition, an IoT-enabled collision avoidance system, an IoT-enabled toll transponder, and/or an IoT-enabled vehicle tracking system. In certain implementations, the smart vehicle 202 can communicate with other smart vehicles to thereby provide vehicle-to-vehicle (V2V) communications. Furthermore, in certain implementations the smart vehicle 202 can operate using vehicle-to-everything (V2X) communications, thereby communicating with traffic lights, toll gates, and/or other IoT-enabled objects.

The wearable 203 of FIG. 6 is also IoT-enabled. Examples of IoT-enabled wearables include, but are not limited to, an IoT-enabled watch, an IoT-enabled eyewear, an IoT-enabled fitness tracker, and/or an IoT-enabled biometric device.

The IoT network 200 also includes the mobile device 204 and base station 205. Thus, in certain implementations user equipment (UE) and/or base stations of a cellular network can operate in an IoT network and be IoT-enabled. Furthermore, a wide variety of IoT-enabled objects can communication using existing network infrastructure, such as cellular infrastructure.

With continuing reference to FIG. 6, IoT is not only applicable to consumer devices and objects, but also to other applications, such as medical, commercial, industrial, aerospace, and/or defense applications. For example, the smart hospital 206 can include a wide variety of IoT-enabled medical equipment and/or the smart factory 207 can include a wide variety of IoT-enabled industrial equipment. Furthermore, airplanes, satellites, and/or aerospace equipment can also be connected to an IoT network. Other examples of IoT applications include, but are not limited to, asset tracking, fleet management, digital signage, smart vending, environmental monitoring, city infrastructure (for instance, smart street lighting), toll collection, and/or point-of-sale.

Although various examples of IoT-enabled objects are illustrated in FIG. 6, an IoT network can include a wide variety of types of objects. Furthermore, any number of such objects can be present in an IoT network. For instance, an IoT network can include millions or billions of IoT-enable objects or things.

IoT-enabled objects can communicate using a wide variety of communication technologies, including, but not limited to, LTE-M (LTE Machine Type Communication), Bluetooth, ZigBee, Z-Wave, 6LowPAN, Thread, Wi-Fi, NFC, Sigfox, Neul, and/or LoRaWAN technologies. Furthermore, certain IoT-enabled objects can communicate using cellular infrastructure, for instance, using 2G, 3G, 4G (including LTE, LTE-Advanced, and/or LTE-Advanced Pro), and/or 5G technologies.

Figure 7A:
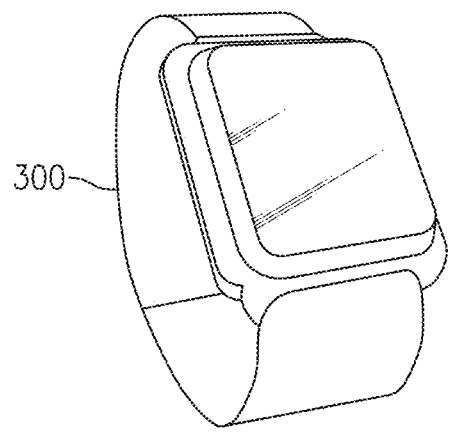
FIG. 7A is a schematic diagram of one example of an IoT-enabled watch.

FIG. 7A is a schematic diagram of one example of an IoT-enabled watch 300. The IoT-enabled watch 300 illustrates one example of a smart wearable that can include a front end system implemented in accordance with one or more features disclosed herein.

Figure 7B:
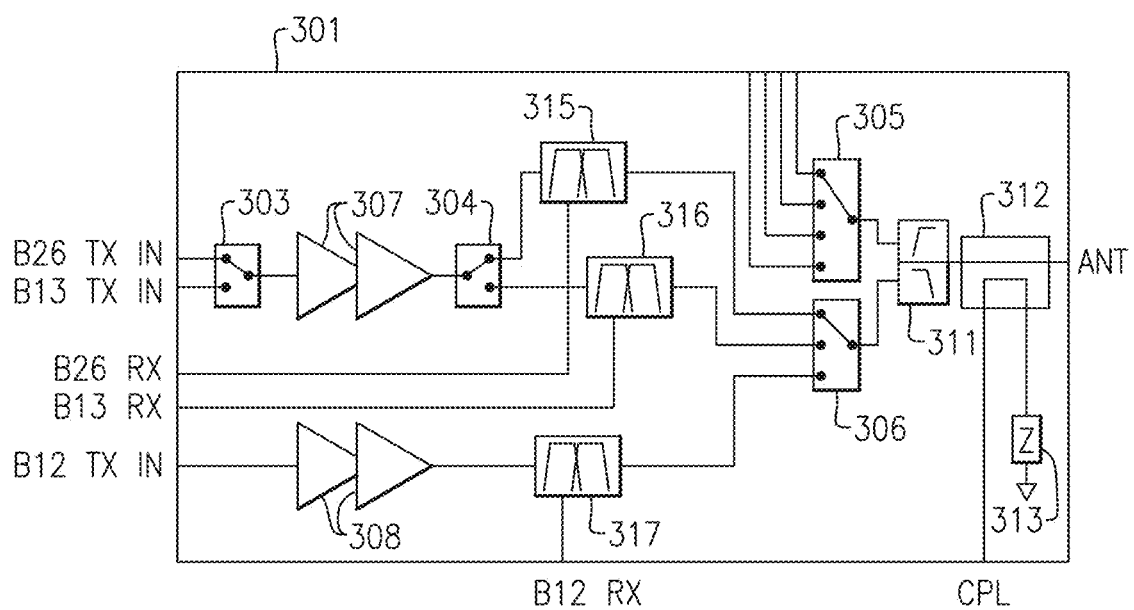
FIG. 7B is a schematic diagram of one example of a front end system for an IoT-enabled object.

FIG. 7B is a schematic diagram of one example of a front end system 301 for an IoT-enabled object, such as the IoT-enabled watch 300 of FIG. 7A. The front end system 301 includes a first transceiver-side switch 303, a second transceiver-side switch 304, a first antenna-side switch 305, a second antenna-side switch 306, a first power amplifier 307, a second power amplifier 308, a duplexer 311, a directional coupler 312, a termination impedance 313, a first band selection filter 315, a second band selection filter 316, and a third band selection filter 317. While not shown, the front end system 301 can further include any of the output matching networks described herein.

In the illustrated embodiment, the first transceiver-side switch 303 selects between a Band 26 transmit input pin (B26 TX IN) and a Band 13 transmit input pin (B13 TX IN). The second transceiver-side switch 303 controls connection of the output of the first power amplifier 307 to the first band selection filter 315 or the first band selection filter 316. Thus, the first power amplifier 307 selectively amplifies Band 26 or Band 13, in this example. Additionally, the second power amplifier 308 amplifies a Band 12 transmit input pin (B12 TX IN). After suitable filtering by the band selection filters 315-317, the second antenna-side switch 306 selects a desired transmit signal for providing to an antenna pin (ANT) via the duplexer 311 and the directional coupler 312. As shown in FIG. 7B, the directional coupler 312 is terminated by the termination impedance 313. Additionally, the first antenna-side switch 305 provides a signal received on the antenna pin (ANT) to a desired receive output pin (four in this example) of the front end system 301. The illustrated front end system 301 also includes various additional pins to provide additional functionality, such as enhanced monitoring of transmit power. For instance, front end system 301 includes a directional coupler output pin (CPL), and feedback pins (B12 RX, B13 RX, and B26 RX) for providing feedback signals associated with transmit signals (for Band 12, Band 13, and Band 26, respectively) generated by the power amplifiers.

The front end system 301 can incorporate one or more features described in the sections herein.

Figure 8A:
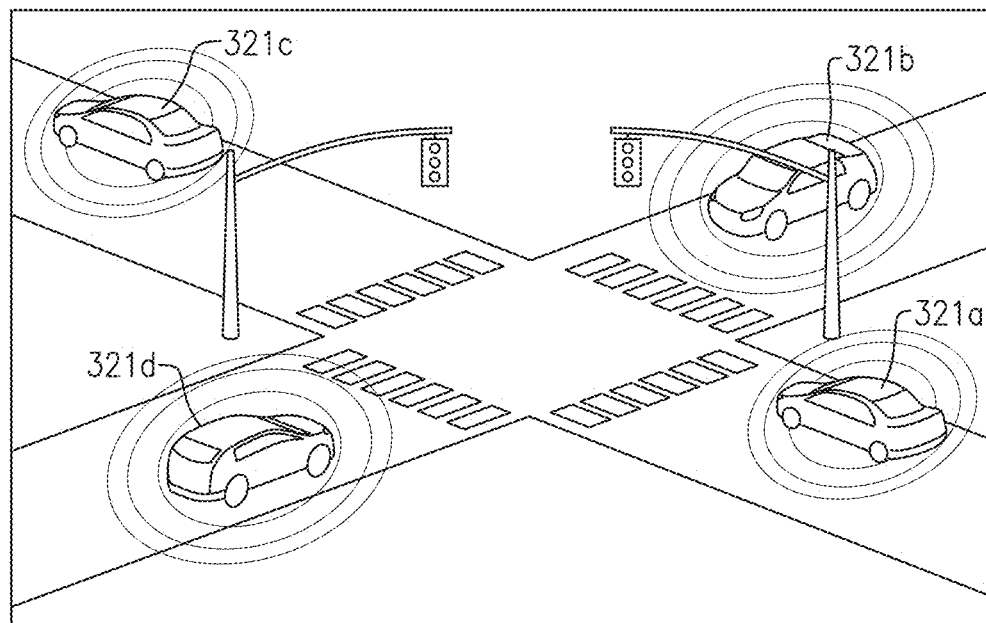
FIG. 8A is a schematic diagram of one example of IoT-enabled vehicles.

FIG. 8A is a schematic diagram of one example of IoT-enabled vehicles 321a-321d. Each of the IoT-enabled vehicles 321a-321d includes a front end system for enabling wireless vehicle-to-vehicle communications. The IoT-enabled vehicles 321a-321d can include a front end system implemented in accordance with one or more features disclosed herein.

Figure 8B:
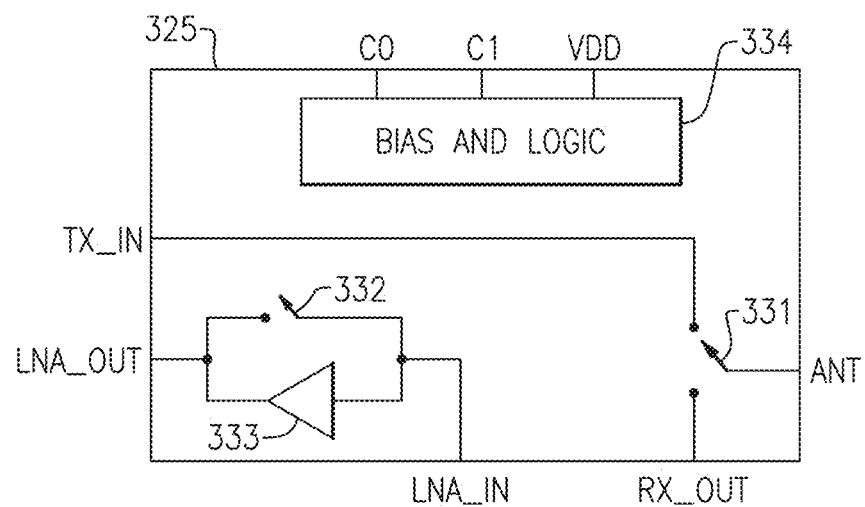
FIG. 8B is a schematic diagram of another example of a front end system for an IoT-enabled object.

FIG. 8B is a schematic diagram of another example of a front end system 325 for an IoT-enabled object. The front end system 325 includes an antenna-side switch 331, a bypass switch 332, an LNA 333, and a bias and logic circuit 334.

The front end system 325 includes control pins (C0 and C1) for controlling the front end system 325 and a supply voltage pin (VDD) for powering the front end system 325. The antenna-side switch 331 selectively connects an antenna pin (ANT) to a transmit signal pin (TX_IN) or a receive signal pin (RX_OUT). The LNA 333 includes an input connected to an LNA input pin (LNA_IN) and an output connected to the LNA output pin (LNA_OUT). The LNA 333 is selectively bypassed by the bypass switch 332. Using external conductors and components, the LNA input pin (LNA_IN) can be connected to the receive signal pin (RX_OUT) either directly or indirectly (for instance, via a filter or other components). Furthermore, an external power amplifier can provide a transmit signal to the transmit signal pin (TX_IN).

The front end system 325 can incorporate one or more features described in the sections herein.

Figure 9A:
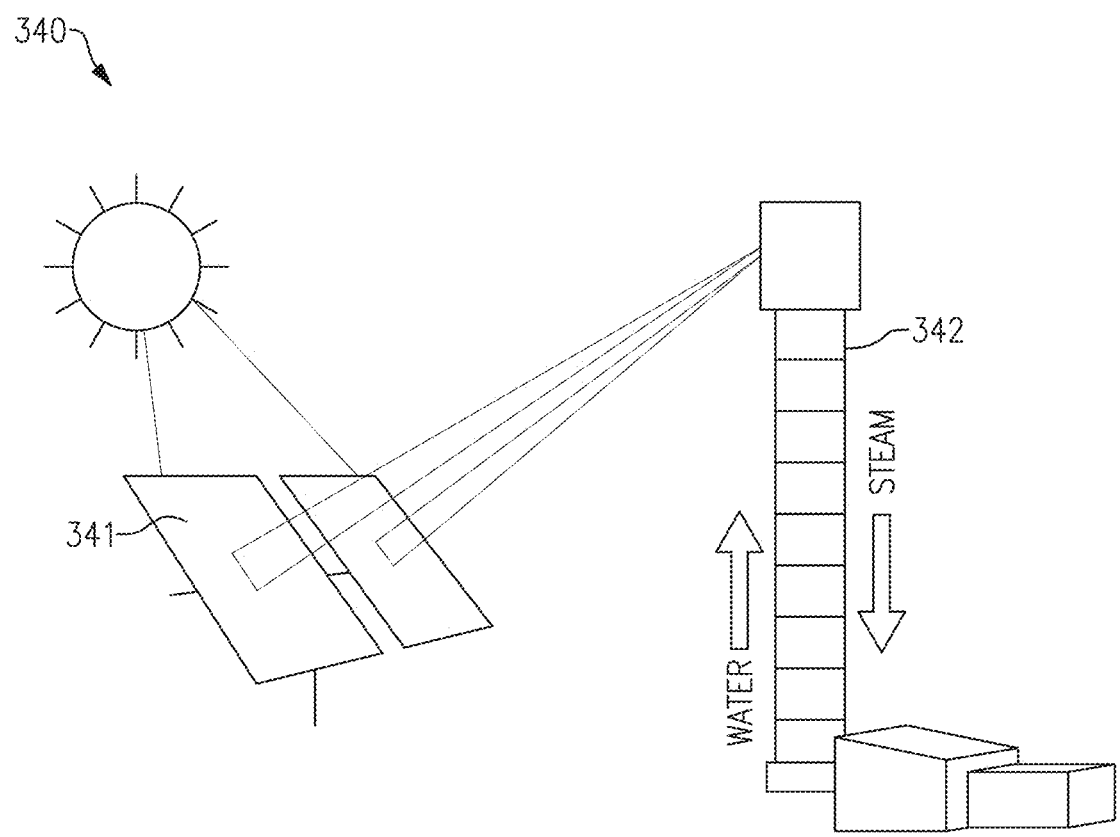
FIG. 9A is a schematic diagram of one example of IoT-enabled industrial equipment.

FIG. 9A is a schematic diagram of one example of IoT-enabled industrial equipment 340. In the illustrated embodiment, the IoT-enabled industrial equipment 340 includes heliostats 341 for reflecting light to a solar receiver and turbine 342. The IoT-enabled industrial equipment 340 can include one or more front end systems for a variety of purposes, such as providing angular positional control of the heliostats 341 to control concentration of solar energy directed toward the solar receiver and turbine 342. The IoT-enabled industrial equipment 340 can include a front end system implemented in accordance with one or more features disclosed herein.

Figure 9B:
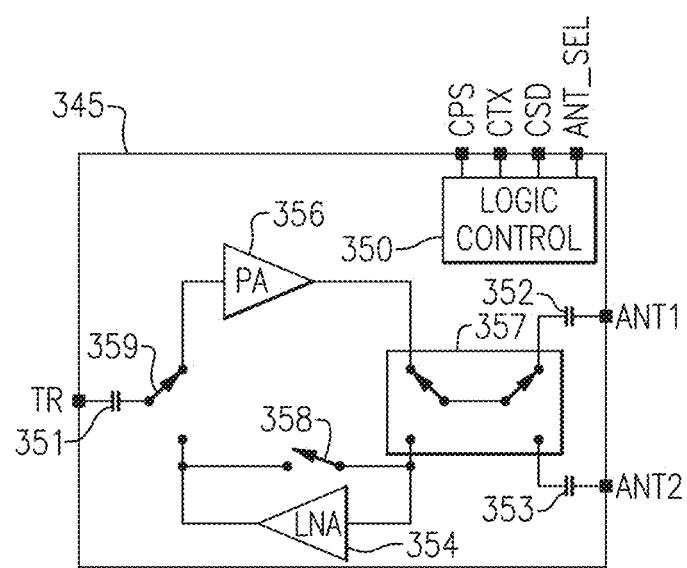
FIG. 9B is a schematic diagram of another example of a front end system for an IoT-enabled object.

FIG. 9B is a schematic diagram of another example of a front end system 345 for an IoT-enabled object, such as the IoT-enabled industrial equipment 340 of FIG. 9A.

The front end system 345 includes a logic control circuit 350, a transceiver DC blocking capacitor 351, a first antenna DC blocking capacitor 352, a second antenna DC blocking capacitor 353, an LNA 354, a power amplifier 356, an antenna-side switch 357, a bypass switch 358, and a transceiver-side switch 359. While not shown, the front end system 301 can further include any of the output matching networks described herein.

The front end system 345 includes control pins (CPS, CTX, CSD, ANT_SEL) for controlling the front end system 345. The antenna-side switch 357 selectively connects either a first antenna pin (ANT1) or a second antenna pin (ANT2) to either an output of the power amplifier 356 or the bypass switch 358/input to the LNA 354. Additionally, the bypass switch 358 selectively bypasses the LNA 354. Furthermore, the transceiver-side switch 359 selectively connected the transceiver pin (TR) to either an input of the power amplifier 356 or the bypass switch 358/output to the LNA 354. The DC blocking capacitors 351-353 serve to provide DC blocking to provide enhanced flexibility in controlling internal DC biasing of the front end system 345.

The front end system 345 can incorporate one or more features described in the sections herein.

Figure 10A:
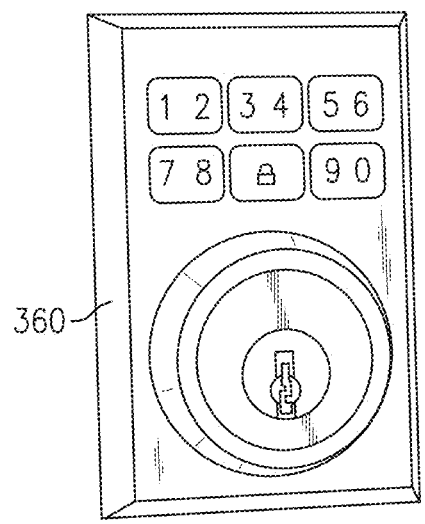
FIG. 10A is a schematic diagram of one example of an IoT-enabled lock.

FIG. 10A is a schematic diagram of one example of an IoT-enabled lock 360. The IoT-enabled lock 360 illustrates one example of an IoT-enabled object that can include a front end system implemented in accordance with one or more features disclosed herein.

Figure 10B:
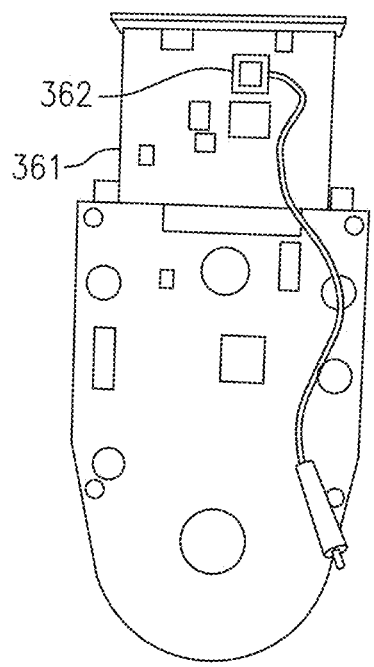
FIG. 10B is a schematic diagram of one example of a circuit board for the IoT-enabled lock of FIG. 10A.

FIG. 10B is a schematic diagram of one example of a circuit board 361 for the IoT-enabled lock 360 of FIG. 10A. The circuit board 361 includes a front end system 362, which can incorporate one or more features described in the sections herein.

Figure 11A:
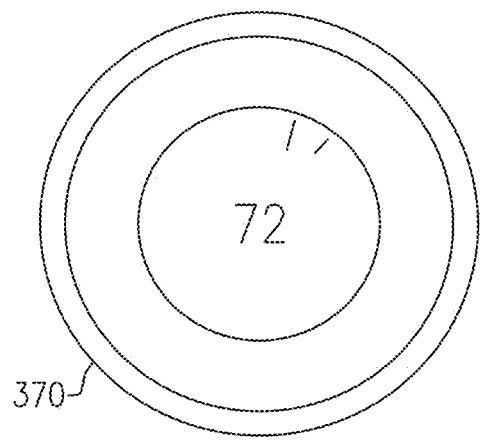
FIG. 11A is a schematic diagram of one example of an IoT-enabled thermostat.

FIG. 11A is a schematic diagram of one example of IoT-enabled thermostat 370. The IoT-enabled thermostat 370 illustrates another example of an IoT-enabled object that can include a front end system implemented in accordance with one or more features disclosed herein.

Figure 11B:
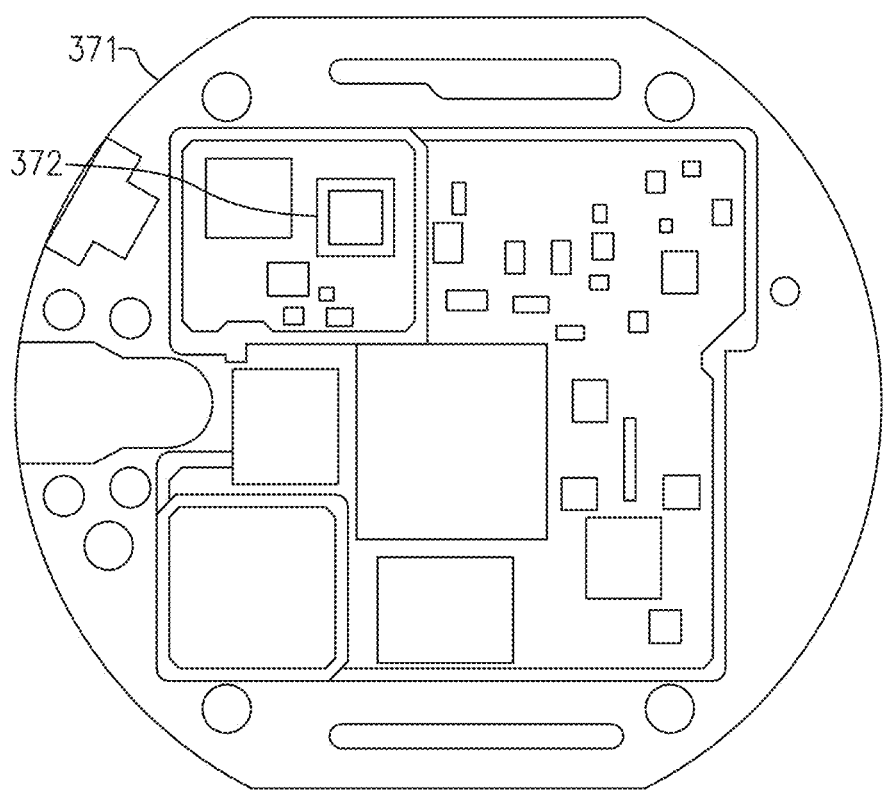
FIG. 11B is a schematic diagram of one example of a circuit board for the IoT-enabled thermostat of FIG. 11A.

FIG. 11B is a schematic diagram of one example of a circuit board 371 for the IoT-enabled thermostat 370 of FIG. 11A. The circuit board 371 includes a front end system 372, which can incorporate one or more features described in the sections herein.

Figure 12A:
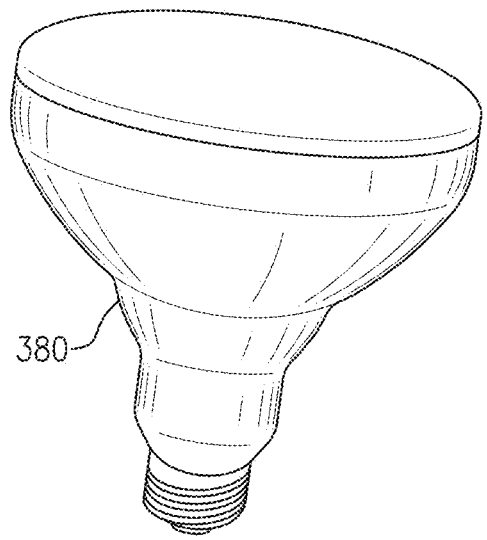
FIG. 12A is a schematic diagram of one example of IoT-enabled light.

FIG. 12A is a schematic diagram of one example of IoT-enabled light 380. The IoT-enabled light 380 illustrates another example of an IoT-enabled object that can include a front end system implemented in accordance with one or more features disclosed herein.

Figure 12B:
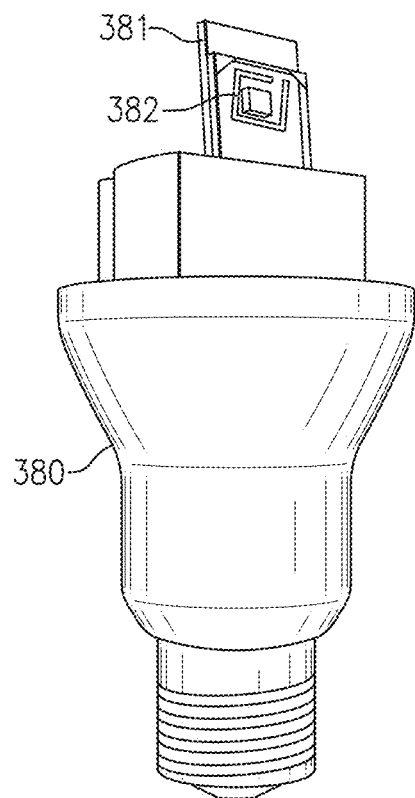
FIG. 12B is a schematic diagram of one example of a circuit board for the IoT-enabled light of FIG. 12A.

FIG. 12B is a schematic diagram of one example of a circuit board 381 for the IoT-enabled light 380 of FIG. 12A. FIG. 12B also depicts a base portion of the IoT-enabled light 380 for housing the circuit board 381. The circuit board 381 includes a front end system 382, which can incorporate one or more features described in the sections herein.

Radio Frequency Systems

FIG. 13A-13F illustrates various schematic block diagrams of examples of radio frequency systems that include a front end system, such as a front end module or front end integrated circuit. The radio frequency systems of FIGS. 13A-13F can incorporate one or more features described in the sections herein. In certain implementations, a radio frequency system, such as any of the radio frequency systems of FIGS. 13A-13F, is implemented on a circuit board (for instance, a printed circuit board (PCB)) of a wireless communication device, such as a mobile phone, a tablet, a base station, a network access point, customer-premises equipment (CPE), an IoT-enabled object, a laptop, and/or a wearable electronic device.

FIG. 13A illustrates a schematic block diagram of one example of a radio frequency system 500. The radio frequency system 500 includes an antenna 501, a front end system 10, and a transceiver 505. As was discussed above, the front end system 10 can incorporate one or more features described in the sections herein.

The antenna 501 operates to wirelessly transmit RF signals received via the antenna-side switch 2. The RF transmit signals can include RF signals generated by the power amplifier 5 and/or RF signals sent via the bypass circuit 4. The output matching network 9 receives the signal generated by the power amplifier 5. The antenna 501 also operates to wirelessly receive RF signals, which can be provided to the LNA 6 and/or the bypass circuit 4 via the antenna-side switch 2. Although an example where a common antenna is used for transmitting and receiving signals, the teachings herein are also applicable to implementations using separate antennas for transmission and reception. Example implementations of the antenna 501 include, but are not limited to, a patch antenna, a dipole antenna, a ceramic resonator, a stamped metal antenna, a laser direct structuring antenna, and/or a multi-layered antenna.

The transceiver 505 operates to provide RF signals to the transceiver-side switch 3 for transmission and/or to receive RF signals from the transceiver-side switch 3. The transceiver 505 can communicate using a wide variety communication technologies, including, but not limited to, one or more of 2G, 3G, 4G (including LTE, LTE-Advanced, and/or LTE-Advanced Pro), 5G, WLAN (for instance, Wi-Fi), WPAN (for instance, LTE-M, Bluetooth and/or ZigBee), WMAN (for instance, WiMAX), and/or GPS technologies.

FIG. 13B illustrates a schematic block diagram of another example of a radio frequency system 506. The radio frequency system 506 includes a front end system 20 and a transceiver 505. As was discussed above, the front end system 20 can incorporate one or more features described in the sections herein.

Figure 13C:
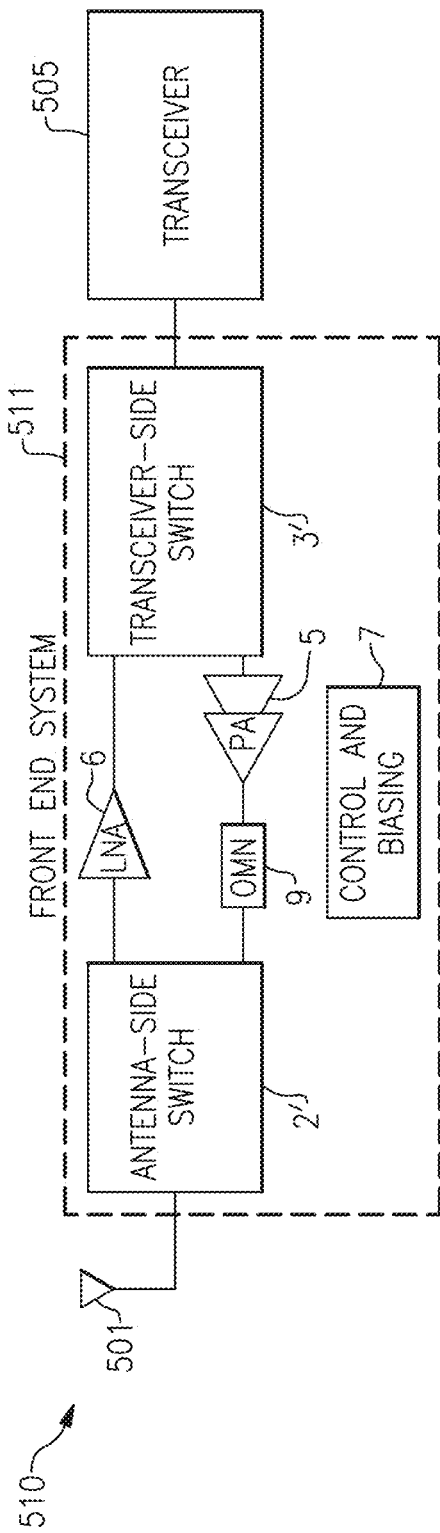
FIG. 13C illustrates a schematic block diagram of another example of a radio frequency system.

FIG. 13C illustrates a schematic block diagram of another example of a radio frequency system 510. The radio frequency system 510 includes an antenna 501, a front end system 511, and a transceiver 505. The front end system 511 of FIG. 13C is similar to the front end system 10 of FIG. 13A, except that the bypass path including the bypass circuit 4 has been omitted and the antenna-side switch 2' and the transceiver-side switch 3' include one less throw. Thus, the antenna-side switch 2' is configured to selectively electrically connect the antenna 501 to either an input to the LNA 6 or an output of the power amplifier 5. Additionally, the transceiver-side switch 3' is configured to selectively electrically connect the transceiver 505 to either an output to the LNA 6 or an input of the power amplifier 5.

Figure 13D:
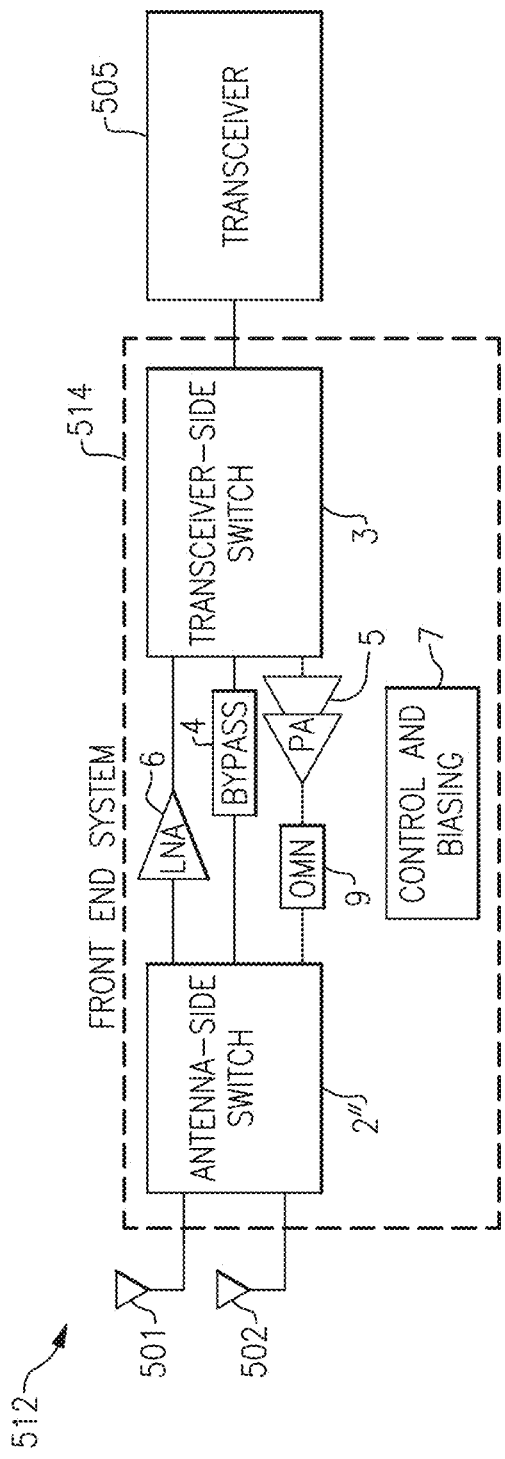
FIG. 13D illustrates a schematic block diagram of another example of a radio frequency system.

FIG. 13D illustrates a schematic block diagram of another example of a radio frequency system 512. The radio frequency system 512 includes a first antenna 501, a second antenna 502, a front end system 514, and a transceiver 505. The front end system 514 of FIG. 13D is similar to the front end system 10 of FIG. 13A, except that the antenna-side switch 2" includes an additional throw to provide connectivity to an additional antenna. Thus, the bypass circuit 4, the power amplifier 5, and/or the LNA 6 can be selectively electrically connected to the first antenna 501 and/or the second antenna 502. Although an example of a radio frequency system with two antennas is shown, a radio frequency system can include more or fewer antennas.

The front end systems 10, 20, 511, 514 of FIGS. 13A-13D can incorporate any of the front end systems described herein, such as those described with respect to FIGS. 1A-4, or any of the corresponding componentry such as any of the output matching networks 9 of those front end systems.

Multiple antennas can be included in a radio frequency system for a wide variety of reasons. In one example, the first antenna 501 and the second antenna 502 correspond to a transmit antenna and a receive antenna, respectively. In a second example, the first antenna 501 and the second antenna 502 are used for transmitting and/or receiving signals associated with different frequency ranges (for instance, different bands). In a third example, the first antenna 501 and the second antenna 502 support diversity communications, such as multiple-input multiple-output (MIMO) communications and/or switched diversity communications. In a fourth example, the first antenna 501 and the second antenna 502 support beamforming of transmit and/or receive signal beams.

Wireless Communication Devices

Figure 14A:
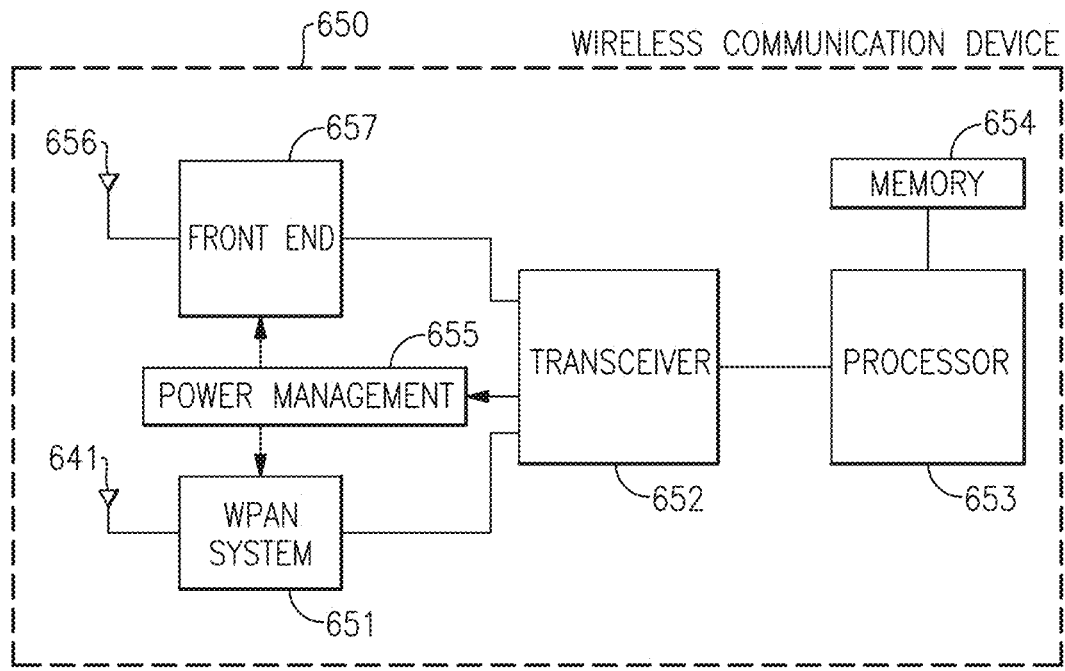
FIG. 14A is a schematic diagram of one example of a wireless communication device.

FIG. 14A is a schematic diagram of one example of a wireless communication device 650. The wireless communication device 650 includes a first antenna 641, a wireless personal area network (WPAN) system 651, a transceiver 652, a processor 653, a memory 654, a power management block 655, a second antenna 656, and a front end system 657.

Any of the suitable combination of features disclosed herein can be implemented in the wireless communication device 650. For example, the WPAN system 651 and/or the front end system 657 can be implemented using any of the features described above and/or in the sections below.

The WPAN system 651 is a front end system configured for processing radio frequency signals associated with personal area networks (PANs). The WPAN system 651 can be configured to transmit and receive signals associated with one or more WPAN communication standards, such as signals associated with one or more of LTE-M (LTE Machine Type Communication), Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

Figure 14B:
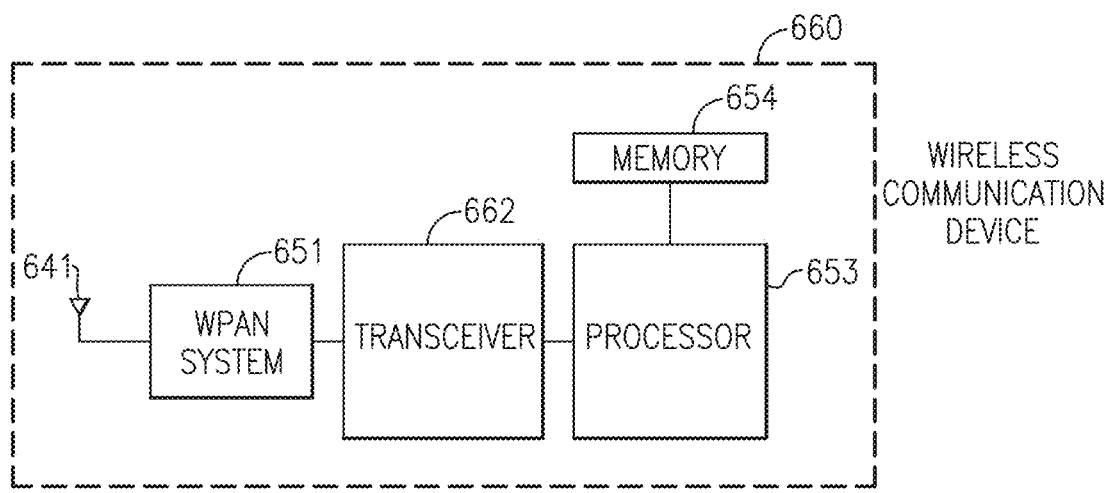
FIG. 14B is a schematic diagram of another example of a wireless communication device.

FIG. 14B is a schematic diagram of another example of a wireless communication device 660. The illustrated wireless communication device 660 of FIG. 14B is a device configured to communicate over a PAN. This wireless communication device 660 can be relatively less complex than the wireless communication device 650 of FIG. 8A. As illustrated, the wireless communication device 660 includes an antenna 641, a WPAN system 651, a transceiver 662, a processor 653, and a memory 654. The WPAN system 660 can include any suitable combination of features disclosed herein. For example, the WPAN system 651 can be implemented using any of the features described above and/or in the sections below.

Figure 14C:
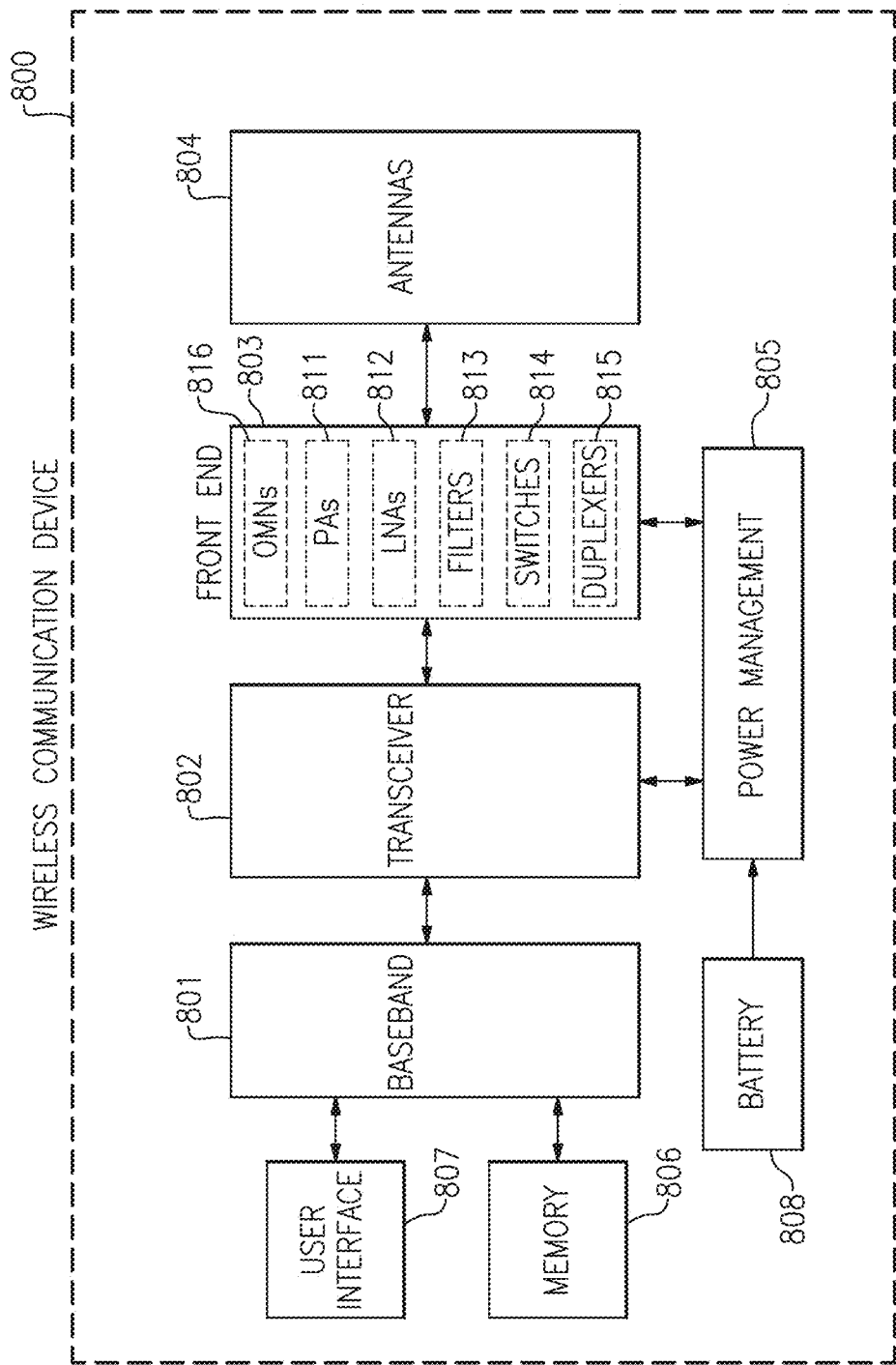
FIG. 14C is a schematic diagram of another example of a wireless communication device.

FIG. 14C is a schematic diagram of another example of a wireless communication device 800. The wireless communication device 800 includes a baseband system 801, a transceiver 802, a front-end system 803, one or more antennas 804, a power management system 805, a memory 806, a user interface 807, and a battery 808.

The wireless communication device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, LTE-M, Bluetooth and ZigBee), WMAN (for instance, WiMAX), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 14C as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes one or more power amplifiers (PAs) 811, one or more low noise amplifiers (LNAs) 812, one or more filters 813, one or more switches 814, and one or more duplexers 815, and one or more output matching networks 816. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Any of the suitable combination of features disclosed herein can be implemented in the wireless communication device 800. For example, the front end system 803 can be implemented using any of the features described above and/or in the sections below.

In certain implementations, the wireless communication device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 800 can operate with beamforming in certain implementations. For example, the front-end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 14C, the baseband system 801 is coupled to the memory 806 of facilitate operation of the wireless communication device 800.

The memory 806 can be used for a wide variety of purposes, such as storing data and/or instructions to facilitate the operation of the wireless communication device 800 and/or to provide storage of user information.

The power management system 805 provides a number of power management functions of the wireless communication device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 14C, the power management system 805 receives a battery voltage from the battery 808. The battery 808 can be any suitable battery for use in the wireless communication device 800, including, for example, a lithium-ion battery.

Some or all of the front end systems 656, 803 or WPAN systems 651 of FIGS. 14A-14C can incorporate any of the front end systems described herein, such as those described with respect to FIGS. 1A-4, or any of the corresponding componentry such as any of the output matching networks 9 of those front end systems.

FIG. 15 is a schematic diagram of an example RF module 2010A that includes a system-on-chip 2012A, an RF front end IC 2012B, a crystal 2012C, and an integrated antenna 2014 according to an embodiment. The system-on-chip 2012A can include one or more of a transceiver, processor (e.g., a baseband processor), and memory. The RF front end IC 2012B can include any of the front end components described herein, such as any of the front end systems of FIGS. 1A-4. For example, the RF front end IC 2012B can include for example any of the power amplifiers, switches, low noise amplifiers, and output matching networks described herein. In some embodiments, the RF front end IC 2012B is a semiconductor-on-insulator (e.g., silicon-on-insulator) die implementing FET-based power amplifier such as the cascade power amplifier of FIG. 3. The RF module 2010A can be a system in a package.

FIG. 15 shows the RF module 2010a in plan view without a top shielding layer, which can also be included. As illustrated, the RF module 2010A includes the component 2012A-2012C on a package substrate 2016, the antenna 2014 on the package substrate 2016, and wire bonds 2018 attached to the package substrate 2016 and surrounding the components 2012A-2012C. The antenna 2014 of the RF module 2010A is outside of an RF shielding structure around the components 2012A-2012C. Accordingly, the antenna 2014 can wirelessly receive and/or transmit RF signals without being shielded by the shielding structure around the components 2012A-2012C. At the same time, the shielding structure can provide RF isolation between the components 2012A-2012C and the antenna 2014 and/or other electronic components.

The components 2012A-2012C can include any suitable circuitry configured to receive, process, and/or provide an RF signal. In certain implementations, the RF front end IC 2012B can include a power amplifier, a low-noise amplifier, an RF switch, a filter, a matching network, or any combination thereof, and can be clocked by a signal derived from the crystal 2012C. An RF signal can have a frequency in the range from about 30 kHz to 300 GHz. In accordance with certain communications standards, an RF signal can be in a range from about 450 MHz to about 6 GHz, in a range from about 700 MHz to about 2.5 GHz, or in a range from about 2.4 GHz to about 2.5 GHz. In certain implementations, the RF component 2012 can receive and/or provide signals in accordance with a wireless personal area network (WPAN) standard, such as LTE-M, Bluetooth, ZigBee, Z-Wave, Wireless USB, INSTEON, IrDA, or Body Area Network. In some other implementations, the RF component and receive and/or provide signals in accordance with a wireless local area network (WLAN) standard, such as Wi-Fi.

The antenna 2014 can be any suitable antenna configured to receive and/or transmit RF signals. The antenna 2014 can be a folded monopole antenna in certain applications. The antenna 2014 can be any suitable shape. For instance, the antenna 2014 can have a meandering shape as shown in FIG. 15. In other embodiments, the antenna can be U-shaped, coil shaped, or any other suitable shape for a particular application. The antenna 2014 can transmit and/or receive RF signals associated with the RF front end IC 2012B. The antenna 2014 can occupy any suitable amount of area of the packaging substrate 2016. For instance, the antenna 2014 can occupy from about 10% to 75% of the area of the package substrate 2016 in certain implementations.

The antenna 2014 can be printed on the packaging substrate 2016. A printed antenna can be formed from one or more conductive traces on the packaging substrate 2016. The one or more conductive traces can be formed by etching a metal pattern on the packaging substrate 2016. A printed antenna can be a microstrip antenna. Printed antennas can be manufactured relatively inexpensively and compactly due to, for example, their 2-dimensional physical geometries. Printed antennas can have a relatively high mechanical durability.

The package substrate 2016 can be a laminate substrate. The package substrate 2016 can include one or more routing layers, one or more insulating layers, a ground plane, or any combination thereof. In certain applications, the package substrate can include four layers. The RF front end IC 2012B can be electrically connected to the antenna 2014 by way of metal routing in a routing layer of the packaging substrate 2016 in certain applications.

The wire bonds 2018 are part of an RF shielding structure around the RF component 2012. An RF shielding structure can be any shielding structure configured to provide suitable shielding associated with RF signals. The wire bonds 2018 can provide RF isolation between the antenna 2014 and some or all of the components 2012A-2012C so as to prevent electromagnetic interference between these components from significantly impacting performance of the antenna 2014 and/or some or all of the components 2012A-2012C. The wire bonds 2018 can surround the RF component 2012 as illustrated. The wire bonds 2018 can be arranged around the components 2012A-2012C in any suitable arrangement, which can be rectangular as illustrated or non-rectangular in some other implementations. In the RF module 2010A illustrated in FIG. 15, the wire bonds 2018 form four walls around the components 2012A-2012C. The wire bonds 2018 can be arranged such that adjacent wire bonds are spaced apart from each other by a distance to provide sufficient RF isolation between the components 2012A-2012C and other electronic components.

FIG. 15 illustrates an RF module in accordance with the principles and advantages discussed herein. The RF module can be selectively shielded, where various RF components can be implemented within a shielding structure. For instance, FIG. 15 shows an example of an RF component that includes three different elements. Other RF components can alternatively or additionally be implemented. A conformal layer can be disposed along at least one side the RF component of the RF module in embodiments in which a shielding layer is formed after singulation of the RF modules. The conformal structure can include any suitable conductive material. For example, the conductive conformal structure can include the same conductive material as the shielding layer in certain applications Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 25 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, multiplexer, devices, modules, wireless communication devices, apparatus, methods, and systems described herein may be embodied in a variety of other forms. Furthermore, various omissions, substitutions and changes in the form of the filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A power amplifier system comprising:
a semiconductor-on-insulator die;
a power amplifier implemented on the semiconductor-on-insulator die and configured to amplify a radio frequency input signal having a fundamental frequency, the power amplifier including an input configured to receive the radio frequency input signal and an output configured to provide an amplified radio frequency signal; and
an output matching circuit implemented on the semiconductor-on-insulator die and including first, second, and third second-order harmonic rejection circuits configured to resonate at about two times the fundamental frequency, and including a third order harmonic rejection circuit configured to resonate at about three times the fundamental frequency, the first and second second-order harmonic rejection circuits being harmonic short circuits and the third second-order harmonic rejection circuit and the third-order harmonic rejection circuit being harmonic open circuits, the first second-order harmonic rejection circuit positioned between the output of the power amplifier and a power low supply voltage, the third-order harmonic rejection circuit positioned between the output of the power amplifier and a first node, the third second-order harmonic circuit positioned between the first node and a second node, and the second second-order harmonic circuit positioned between the second node and the power low supply voltage.

2. The power amplifier system of claim 1 further comprising biasing circuitry implemented on the die and configured to bias the power amplifier, and a switch implemented on the die and configured to control connection of signal paths to an antenna.

3. The power amplifier system of claim 1 wherein the power amplifier includes two field effect transistors arranged in a cascade configuration.

4. The power amplifier system of claim 1 wherein the third-order harmonic rejection circuit includes a capacitor and an inductor, and the inductor is implemented as a surface mount device on a module supporting the semiconductor-on-insulator die.

5. The power amplifier system of claim 4 wherein the first second-order harmonic rejection circuit includes a tunable bank of at least two capacitors.

6. The power amplifier system of claim 1 further comprising a biasing circuit including a decoupling capacitor and a choke inductor, the choke inductor embedded in a substrate of a module supporting the semiconductor-on-insulator die.

7. A semiconductor-on-insulator die comprising:
a power amplifier configured to amplify a radio frequency input signal having a fundamental frequency, the power amplifier including an input configured to receive the radio frequency input signal and an output configured to provide an amplified radio frequency signal; and
an output matching circuit including first and second second-order harmonic rejection circuits configured to resonate at about two times the fundamental frequency and a third order harmonic rejection circuit configured to resonate at about three times the fundamental frequency, and further including a third second-order harmonic rejection circuit, the first and second second-order harmonic rejection circuits being harmonic short circuits and the third second-order harmonic rejection circuit and the third-order harmonic rejection circuit being harmonic open circuits, the first second-order harmonic rejection circuit positioned between the output of the power amplifier and a power low supply voltage, the third-order harmonic rejection circuit positioned between the output of the power amplifier and a first node, the third second-order harmonic circuit positioned between the first node and a second node, and the second second-order harmonic circuit positioned between the second node and the power low supply voltage.

8. The die of claim 7 wherein the power amplifier includes two field effect transistors arranged in a cascade configuration.

9. The die of claim 7 wherein the die further includes biasing circuitry configured to bias the power amplifier, a switch configured to control connection of signal paths to an antenna, and a controller configured to control the power amplifier and the switch.

10. A mobile device comprising:
a module including a semiconductor-on-insulator die mounted thereon, the die including a power amplifier configured to amplify a radio frequency input signal having a fundamental frequency, the power amplifier including an input configured to receive the radio frequency input signal and an output configured to provide an amplified radio frequency signal, the die further including an output matching circuit including first, second, and third second-order harmonic rejection circuits configured to resonate at about two times the fundamental frequency and a third order harmonic rejection circuit configured to resonate at about three times the fundamental frequency, the first and second second-order harmonic rejection circuits being harmonic short circuits and the third second-order harmonic rejection circuit and the third-order harmonic rejection circuit being harmonic open circuits, the first second-order harmonic rejection circuit positioned between the output of the power amplifier and a power low supply voltage, the third-order harmonic rejection circuit positioned between the output of the power amplifier and a first node, the third second-order harmonic circuit positioned between the first node and a second node, and the second second-order harmonic circuit positioned between the second node and the power low supply voltage; and
a radio frequency antenna.

11. The mobile device of claim 10 wherein the radio frequency antenna is included on the module.

12. The mobile device of claim 10 further comprising a biasing circuit including a decoupling capacitor and a choke inductor, the decoupling capacitor implemented on the die and the choke inductor embedded in a substrate of the module.

13. The mobile device of claim 10 further wherein the third order harmonic rejection circuit includes a capacitor implemented on the die and a surface mounted inductor mounted on the module.

14. The power amplifier system of claim 1 further comprising an antenna-side switch implemented on the semiconductor-on-insulator die, coupled between the output matching circuit and an antenna, and configured to connect a transmit path that includes the power amplifier to the antenna.

15. The power amplifier system of claim 14 further comprising a transceiver-side switch implemented on the semiconductor-on-insulator die and coupled between the power amplifier and a transceiver.

16. The die of claim 7 further comprising an antenna-side switch implemented on the semiconductor-on-insulator die, coupled between the output matching circuit and an antenna, and configured to connect a transmit path that includes the power amplifier to the antenna.

17. The die of claim 16 further comprising a transceiver-side switch implemented on the semiconductor-on-insulator die and coupled between the power amplifier and a transceiver.

18. The mobile device of claim 10 further comprising an antenna-side switch implemented on the semiconductor-on-insulator die, coupled between the output matching circuit and the radio frequency antenna, and configured to connect a transmit path that includes the power amplifier to the radio frequency antenna.

19. The mobile device of claim 18 further comprising a transceiver and a transceiver-side switch, the transceiver-side switch implemented on the semiconductor-on-insulator die and coupled between the power amplifier and the transceiver.

20. The mobile device of claim 10 wherein the power amplifier includes two field effect transistors arranged in a cascade configuration.

* * * * *